(12) United States Patent
McGrail et al.

(10) Patent No.: US 11,591,493 B2
(45) Date of Patent: Feb. 28, 2023

(54) CURABLE COMPOSITIONS

(71) Applicant: Arkema France, Colombes (FR)

(72) Inventors: Brendan McGrail, Phoenixville, PA (US); William Wolf, Philadelphia, PA (US)

(73) Assignee: Arkema France, Colombes (FR)

( * ) Notice: Subject to any disclaimer, the term of this patent is extended or adjusted under 35 U.S.C. 154(b) by 164 days.

(21) Appl. No.: 16/957,504

(22) PCT Filed: Dec. 4, 2018

(86) PCT No.: PCT/EP2018/083436
§ 371 (c)(1),
(2) Date: Jun. 24, 2020

(87) PCT Pub. No.: WO2019/129464
PCT Pub. Date: Jul. 4, 2019

(65) Prior Publication Data
US 2021/0395563 A1    Dec. 23, 2021

Related U.S. Application Data

(60) Provisional application No. 62/611,723, filed on Dec. 29, 2017.

(51) Int. Cl.
| | | |
|---|---|---|
| C08F 2/46 | (2006.01) | |
| C08F 2/50 | (2006.01) | |
| C08G 61/04 | (2006.01) | |
| C09D 163/10 | (2006.01) | |
| B33Y 70/00 | (2020.01) | |
| B29C 64/124 | (2017.01) | |
| C09D 7/65 | (2018.01) | |
| B29K 33/00 | (2006.01) | |
| B29K 63/00 | (2006.01) | |
| B29K 105/00 | (2006.01) | |

(52) U.S. Cl.
CPC .......... *C09D 163/10* (2013.01); *B29C 64/124* (2017.08); *B33Y 70/00* (2014.12); *C09D 7/65* (2018.01); *B29K 2033/08* (2013.01); *B29K 2063/00* (2013.01); *B29K 2105/0091* (2013.01)

(58) Field of Classification Search
CPC . B33Y 7/00; G03F 7/027; G03F 7/038; G03F 7/0042; G03F 7/0037; C09D 7/65; C09D 163/10; B29C 64/124; B29K 2063/00; B29K 2105/0091; B29K 2033/08
USPC ............................................. 522/3, 1; 520/1
See application file for complete search history.

(56) References Cited

U.S. PATENT DOCUMENTS

| | | | |
|---|---|---|---|
| 3,459,790 A | 8/1969 | Smith | |
| 3,835,003 A | 9/1974 | Schlesinger | |
| 3,899,382 A | 8/1975 | Matsuda et al. | |
| 4,215,195 A | 7/1980 | Ponticello et al. | |
| 5,674,922 A | 10/1997 | Igarashi et al. | |
| 5,750,590 A | 5/1998 | Schaefer et al. | |
| 5,852,094 A | 12/1998 | Noomen et al. | |
| 5,872,297 A * | 2/1999 | Trumbo | C07C 235/80 |
| | | | 564/384 |
| 5,981,616 A | 11/1999 | Yamamura et al. | |
| 6,015,914 A | 1/2000 | Sasaki et al. | |
| 6,287,748 B1 | 9/2001 | Lawton | |
| 6,399,672 B1 * | 6/2002 | Ceska | C07F 9/091 |
| | | | 428/513 |
| 6,469,108 B2 | 10/2002 | Kuriyama et al. | |
| 6,833,231 B2 | 12/2004 | Moussa et al. | |
| 6,989,225 B2 | 1/2006 | Steinmann | |
| 7,183,040 B2 | 2/2007 | Thies et al. | |
| 8,980,971 B2 | 3/2015 | Ueda et al. | |
| 9,090,020 B2 | 7/2015 | Xu | |
| 2004/0137368 A1 | 7/2004 | Steinmann | |
| 2005/0040562 A1 | 2/2005 | Steinmann et al. | |
| 2007/0054969 A1 | 3/2007 | Bailey et al. | |
| 2010/0104832 A1 * | 4/2010 | Messe | G03F 7/038 |
| | | | 427/510 |
| 2010/0222512 A1 | 9/2010 | Sridhar et al. | |

FOREIGN PATENT DOCUMENTS

| | | | | |
|---|---|---|---|---|
| EP | 0095269 A2 | 11/1983 | | |
| EP | 2842980 A1 * | 3/2015 | ............... | A61C 7/08 |
| EP | 2842980 A1 | 3/2015 | | |
| JP | S62288618 | 12/1987 | | |
| JP | 2008509398 | 3/2008 | | |
| JP | 2014024900 | 2/2014 | | |
| WO | 9323794 A1 | 11/1993 | | |
| WO | WO-9323794 A1 * | 11/1993 | ............... | B24D 3/28 |
| WO | 03001295 A1 | 1/2003 | | |
| WO | 2009070500 A1 | 6/2009 | | |
| WO | 2012082348 A1 | 6/2012 | | |

OTHER PUBLICATIONS

International Search Report of International Application No. PCT/EP2018/083436 dated Mar. 26, 2019.

* cited by examiner

*Primary Examiner* — Jessica Whiteley
(74) *Attorney, Agent, or Firm* — Christopher R. Lewis

(57) ABSTRACT

Heterocyclic-functional resins, such as epoxides, oxetanes, cyclic carbonates, lactides and lactones, are used in radiation-curable formulations along with ethylenically unsaturated materials such as (meth)acrylates to achieve improved mechanical properties and/or lower shrinkage in the cured compositions prepared therefrom as compared to formulations containing the ethylenically unsaturated materials but no heterocyclic-functional resin. Polymerizable, ethylenically unsaturated metal complexes, such as Zn and Ca carboxylates prepared using unsaturated carboxylic acids or anhydrides, may be employed to effect thermal cure of the heterocyclic-functional resin component of such formulations, which are particularly useful in the production of 3D-printed articles and the like.

23 Claims, 4 Drawing Sheets

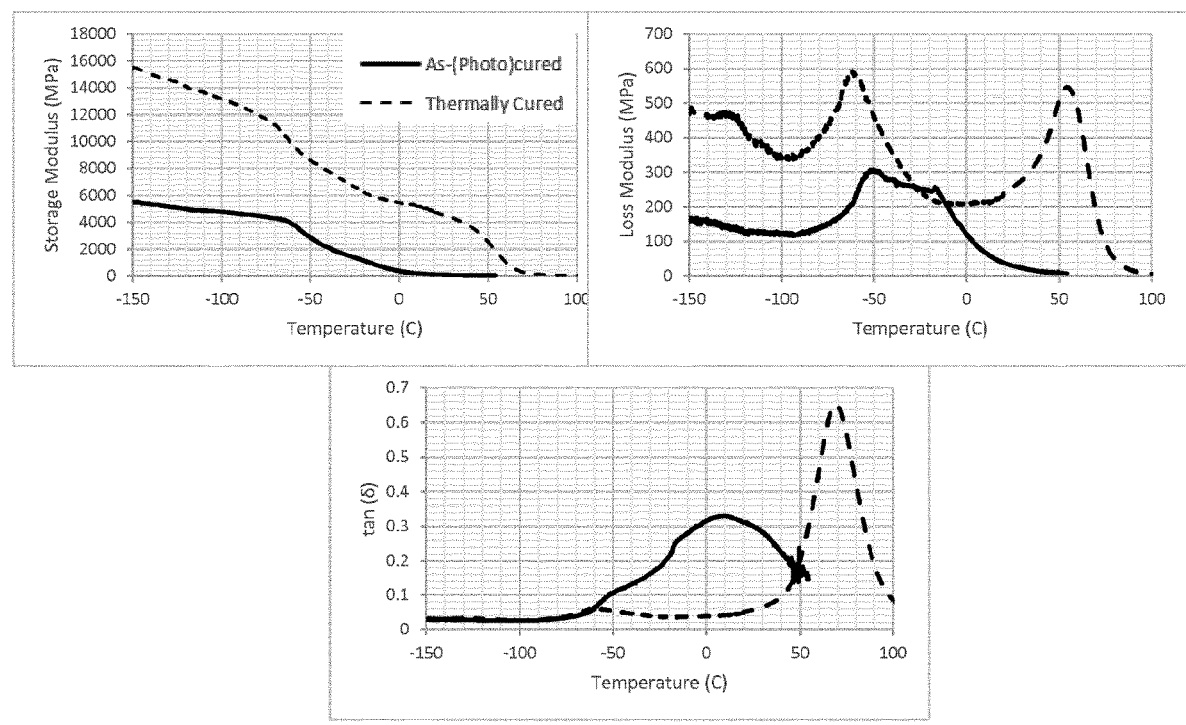
Figure 1. Dynamic mechanical thermograms of the cured composition of Example 1. Solid line: as-(photo)cured sample; broken line: thermally cured sample.

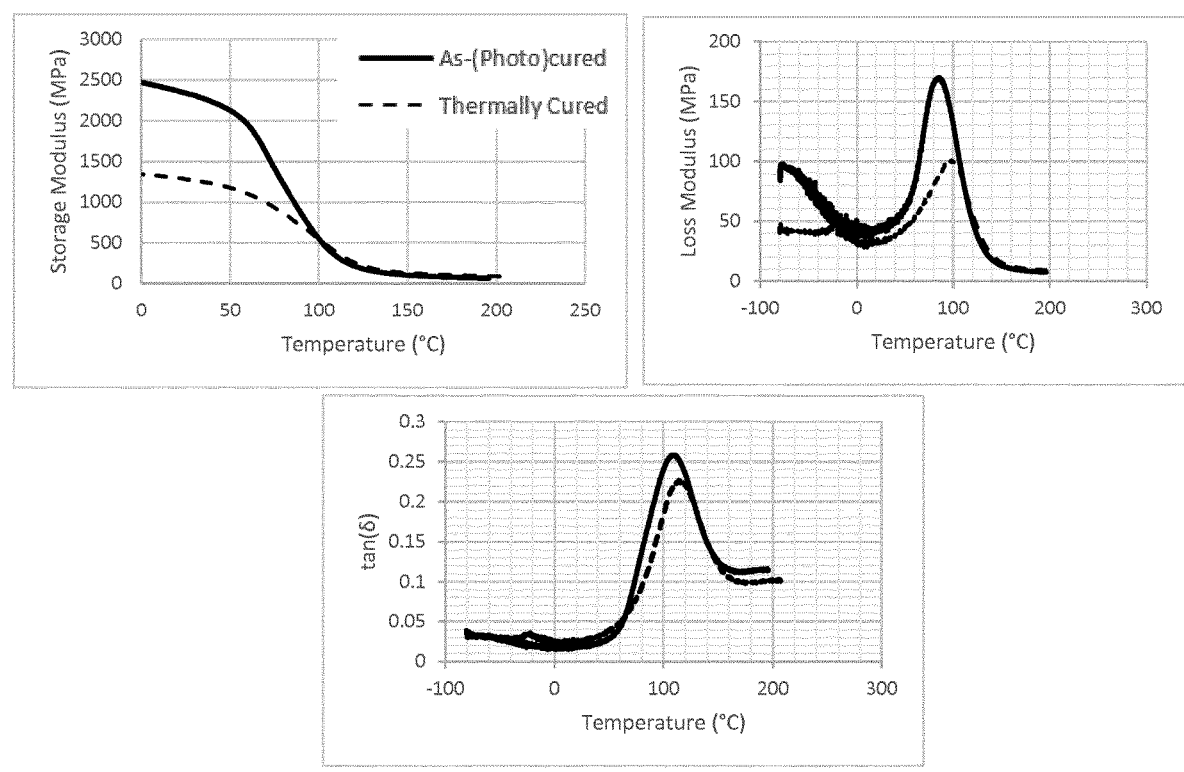
Figure 2. Dynamic mechanical thermograms of the cured composition of Example 2. Solid line: as-(photo)cured sample; broken line: thermally cured sample.

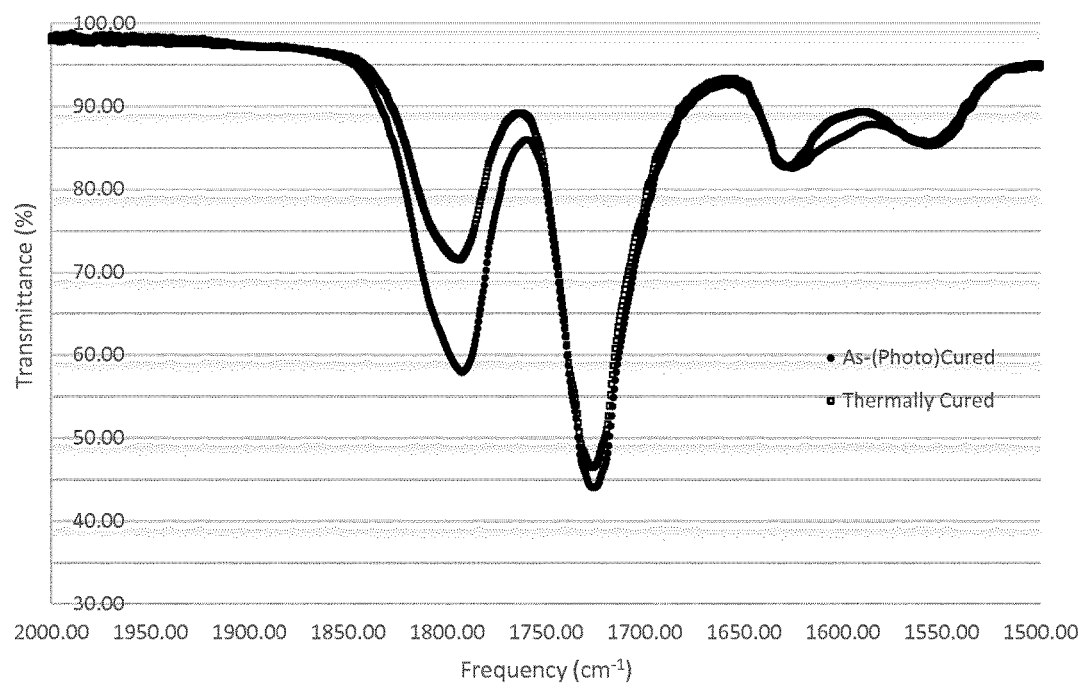
Figure 3. Fourier Transform – Infrared (FT-IR) spectrum of the cured resin of Example 2. Sample as-(photo)cured: filled markers; thermally cured sample: open markers

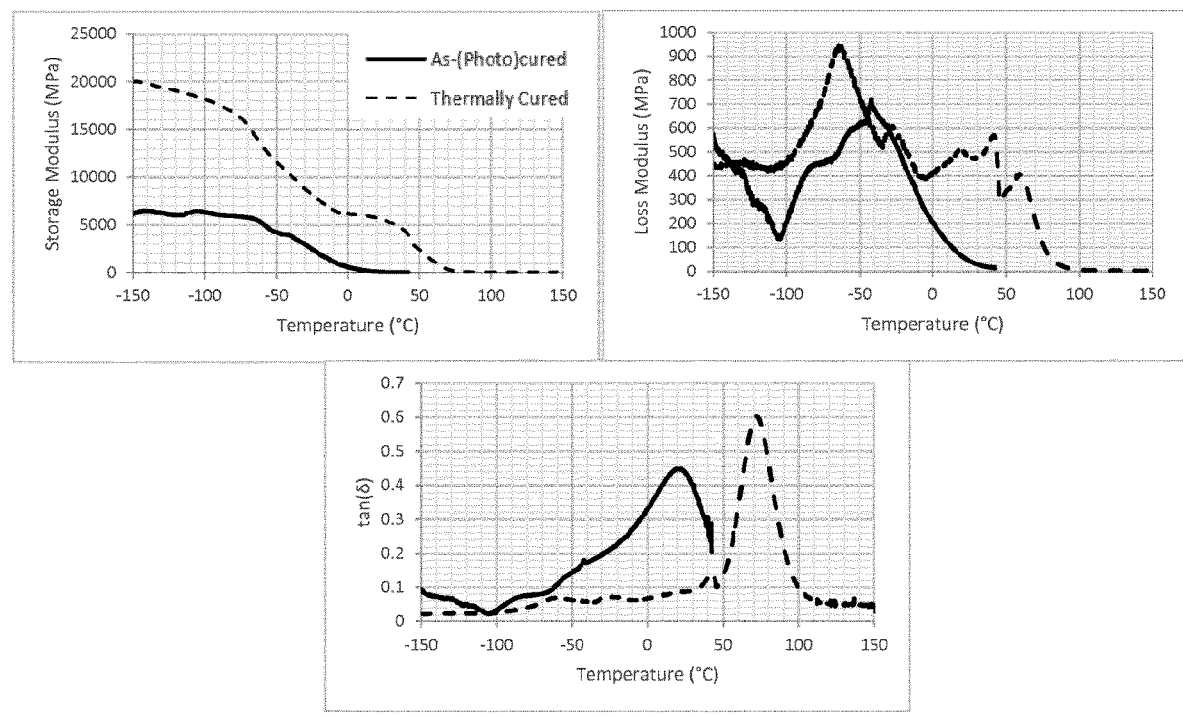
Figure 4. Dynamic mechanical thermograms of the cured composition of Example 3. Solid line: as-(photo)cured sample; broken line: thermally cured sample.

CURABLE COMPOSITIONS

CROSS-REFERENCE TO RELATED APPLICATIONS

This application is a U.S. national stage application under 35 U.S.C. §371 of international application number PCT/EP2018/083436, filed on Dec. 4, 2018, which claims priority to U.S. patent application No. 62/611,723, filed on Dec. 29, 2017.

FIELD OF THE INVENTION

The present invention relates to compositions based on polymerizable, ethylenically unsaturated compounds (including polymerizable, ethylenically unsaturated metal complexes) and polymerizable, heterocyclic moiety-containing compounds that are capable of being cured by radiation and heat and that are particularly useful in three dimensional printing applications.

BACKGROUND OF THE INVENTION

Epoxy- and oxetane-functional resins have been incorporated into radiation-curable formulations based on (meth) acrylate-functional materials for the purpose of imparting better mechanical properties and lower shrinkage upon curing than is achievable using (meth)acrylate-functional materials by themselves. Most of these formulations utilize cationic photoinitiators such as sulfonium and iodonium salts that have low absorptivities at long wavelengths, which limits the speed at which the cyclic ether-functional components can be cured.

SUMMARY OF THE INVENTION

Accordingly, it would be desirable to develop formulations containing both cyclic ether-functional resins and (meth)acrylate-functional materials that can be quickly cured by heating to react the cyclic ether-functional resins, following an initial curing of the (meth)acrylate-functional materials using radiation.

It has now been discovered that by including one or more polymerizable, ethylenically unsaturated metal complexes (such as metal-containing (meth)acrylates) in a curable composition containing one or more polymerizable, ethylenically unsaturated compounds (other than the aforementioned polymerizable, ethylenically unsaturated metal complexes) and one or more polymerizable heterocyclic moiety-containing compounds, such curable compositions may be thermally cured within a desirably short period of time. Accordingly, the polymerizable, ethylenically unsaturated metal complexes have the effect of accelerating the thermal cure and/or initiating or catalyzing the polymerization of the heterocyclic moiety-containing compounds, thus making the curable compositions particularly well suited for use in applications such as three dimensional printing where the ability to provide finished articles at a high production rate is desirable. Moreover, the metal complexes become part of a polymeric network upon radiation curing (e.g., photocuring) of the curable composition, as a consequence of the polymerizable, ethylenically unsaturated functionality present within such compounds. In contrast to previously known "dual cure" formulations based on cyclic ether- and (meth) acrylate-functionalized compounds, cationic photoinitiators need not be used and ethylenically unsaturated materials containing urethane functionality (such as (meth)acrylate-functionalized urethane oligomers) thus may be included in the curable composition without interfering with the ability to quickly achieve a high degree of curing of the cyclic ether-containing components.

Thus, when a polymerizable, ethylenically unsaturated metal complex (such as a Zn or Ca salt of a carboxylate containing (meth)acrylate functionality) is present in a curable composition containing other polymerizable, ethylenically unsaturated compounds (such as (meth)acrylate-functionalized monomers and oligomers) and heterocyclic moiety-containing compounds (such as epoxides, oxetanes, cyclic carbonates, lactides and lactones), the metal complex is photopolymerizable (through its ethylenically unsaturated functional groups) along with the other polymerizable, ethylenically unsaturated compounds and the metal center is catalytically active in the photocured network toward the ring-opening polymerization of the heterocyclic moiety-containing compounds. Without wishing to be bound by theory, it is believed that the curable compositions of the present invention result in a dual interpenetrating polymeric network after being fully cured.

BRIEF DESCRIPTION OF THE DRAWING

FIG. 1 shows dynamic mechanical thermograms of the cured resin of Example 1.

FIG. 2 shows dynamic mechanical thermograms of the cured resin of Example 2.

FIG. 3 shows the Fourier Transform—Infrared (FT-IR) spectrum of the cured resin of Example 2.

FIG. 4 shows dynamic mechanical thermograms of the cured resin of Example 3.

DETAILED DESCRIPTION OF THE INVENTION

Embodiments of the curable compositions of the present invention may comprise:
a) at least one polymerizable, ethylenically unsaturated metal complex;
b) at least one polymerizable, ethylenically unsaturated compound other than a polymerizable, ethylenically unsaturated metal complex;
c) at least one polymerizable heterocyclic moiety-containing compound other than an epoxy-containing compound;
d) optionally, at least one photoinitiator; and
e) optionally, at least one impact modifier.

In certain embodiments, the curable composition may comprise, for example:
a) 5% to 70% (or 5% to 20% or 7% to 15%) by weight of at least one polymerizable, ethylenically unsaturated metal complex;
b) 15% to 60% (or 20% to 50% or 25% to 45%) by weight of at least one polymerizable, ethylenically unsaturated compound other than a polymerizable, ethylenically unsaturated metal complex;
c) 20% to 60% (or 35% to 60% or 50% to 60%) by weight of at least one polymerizable heterocyclic moiety-containing compound other than an epoxy-containing compound;
d) 0% to 5% (or 0.1% to 5% or 1% to 4.5%) by weight of at least one photoinitiator; and
e) 0% to 20% by weight (e.g., 0.5 to 15% by weight) of at least one impact modifier; the weight % of each component being based on the total weight of the curable composition.

Polymerizable, Ethylenically Unsaturated Metal Complexes

The curable compositions of the present invention include at least one polymerizable, ethylenically unsaturated metal complex. Two or more polymerizable, ethylenically unsaturated metal complexes may be present in the curable composition. As used herein, the term "polymerizable" means a substance capable of combining by covalent bonding in an addition polymerization. A polymerizable, ethylenically unsaturated metal complex may contain one, two, three or more sites of ethylenic unsaturation (i.e., two or more ethylenically unsaturated functional groups).

Suitable ethylenically unsaturated functional groups suitable include groups containing at least one carbon-carbon double bond, in particular a carbon-carbon double bond capable of participating in a reaction (e.g., a free radical reaction) wherein at least one carbon of the carbon-carbon double bond becomes covalently bonded to an atom, in particular a carbon atom, in a second molecule. Such reactions may result in a polymerization or curing whereby the compound(s) containing one or more ethylenically unsaturated functional groups become(s) part of a polymerized matrix or polymeric chain. The carbon-carbon double bond may, for example, be present as part of an α,β-unsaturated carbonyl moiety, e.g., an α,β-unsaturated ester moiety such as an acrylate functional group ($H_2C=CH-C(=O)O-$) or a methacrylate functional group ($H_2C=C(CH_3)-C(=O)O-$). As used herein, the term "(meth)acrylate" refers to both acrylate ($-O-C(=O)CH=CH_2$) and methacrylate ($-O-C(=O)C(CH_3)=CH_2$) functional groups. (Meth)acrylamide functional groups can also function as suitable ethylenically unsaturated functional groups. As used herein, the term "(meth)acrylamide" refers to both acrylamide ($-NR-C(=O)CH=CH_2$) and methacrylamide ($-NR-C(=O)C(CH_3)=CH_2$) functional groups, wherein R is hydrogen (H) or an organic moiety (such as an alkyl group, for example). A carbon-carbon double bond may also be present in the ethylenically unsaturated functional group in the form of a vinyl group $-CH=CH_2$ or an allyl group, $-CH_2-CH=CH_2$.

The presence of polymerizable sites of ethylenic unsaturation in the metal complexes employed in the curable compositions of the present invention thus differentiate such compositions over formulations known in the art which contain metal carboxylates or metal acetylacetonates that lack such polymerizable ethylenically unsaturated moieties, such as the cyclic ester dual cure resins described in US Pat. Pub. No. 2017/0174827. The polymerizable, ethylenically unsaturated metal complexes present in the curable compositions of the present invention, unlike the saturated (non-polymerizable) metal carboxylates and acetylacetonates of US Pat. Pub. No. 2017/0174827, become covalently incorporated into the polymer network formed upon photocuring, which allows for a greater range of responses on secondary (thermal) curing. It is believed that the most important among these responses is the ability to use the thermal cure step to produce a softer material than was formed during the photochemical cure step (as described in Example 2 of this application, for instance). Another advantage of using polymerizable, ethylenically unsaturated metal complexes as taught herein is that they reduce the mobility of the metals in the final cured article prepared from the curable composition. This reduces the possibility of leaching of the metal(s) from the cured resin into the surrounding environment, making articles produced from the curable compositions more suitable for end-use application in which the cured articles are in contact with the human body or in other applications where metal contamination is a concern.

Suitable polymerizable, ethylenically unsaturated metal complexes are complexes of at least one metal which, in complexed form, is capable or initiating or catalyzing the polymerization or curing of the heterocyclic moiety-containing compound(s) present in the curable composition. As used herein, the term "metal" includes both elements that are true metals as well as elements that are regarded as alkaline earth metals. Metals having such activity include, for example, Zn, Ca, Mg, Al, Zr, Hf, Ga, Ti, Cr, La, Ce, Nd, Sm, Gd, Tb, Dy, Ho, Er, Tm, Yb and Lu. According to certain embodiments of the invention, the metal is divalent or trivalent. More than one metal may be present in the polymerizable, ethylenically unsaturated metal complex. The metal or metals may be complexed by (associated with) one or more ethylenically unsaturated organic ligands. Preferably, the polymerizable, ethylenically unsaturated metal complex is soluble in the curable composition at 25° C. That is, the curable composition is preferably a homogeneous liquid at 25° C. Ethylenically unsaturated carboxylate, ethylenically unsaturated beta-diketonate and ethylenically unsaturated beta-diketamide ligands are examples of particularly suitable organic ligands.

Salts of ethylenically unsaturated carboxylic acids are generally useful in the present invention, including for example salts of relatively low carbon number ethylenically unsaturated carboxylic acids such as acrylic acid, methacrylic acid and maleic acid. However, metal salts of such low carbon number acids, such as zinc acrylate, may have rather limited solubility in the other components of the curable composition. For this reason, according to certain aspects, the curable compositions of the present invention may preferably include at least one polymerizable, ethylenically unsaturated metal complex which is a salt of an ethylenically unsaturated carboxylic acid comprised of six or more carbon atoms. Such salts, by virtue of including at least one carboxylate group containing a relatively large number of carbon atoms, have increased solubility in organic media, in particular improved solubility in the other components of the curable composition, as compared to analogous salts of shorter chain ethylenically unsaturated carboxylic acids such as (meth)acrylic acid. Salts of this type are sometimes referred to in the art as "oil-soluble". Generally speaking, the solubility of the salt in organic media will tend to increase as the number of carbon atoms is increased, although to some extent the solubility will also depend upon the type of structural moiety or types of structural moieties in which the carbon atoms are present, as well as other types of atoms and functional groups which may be present. In various embodiments of the invention, the ethylenically unsaturated carboxylic acid may, for example, contain six, seven, eight, nine, ten, eleven, twelve, thirteen, fourteen, fifteen or more carbon atoms. In other embodiments, the ethylenically unsaturated carboxylic acid contains no more than 30, no more than 25 or no more than 20 carbon atoms. The carbon atoms may be aliphatic carbon atoms (including carbon atoms participating in carbon-carbon double bonds), as well as aromatic carbon atoms.

Suitable ethylenically unsaturated carboxylic acids are carboxylic acids which contain at least one carbon-carbon double bond (i.e., at least one site of ethylenic unsaturation). Such double bonds render the salts of the ethylenically unsaturated carboxylic acid capable of participating in the reactions which occur when the curable composition is cured, which may involve, for example, a free radical or cationic polymerization mechanism. While any such carbon-carbon double bond may be present, in various embodiments of the invention the carbon-carbon double bond(s) is or are furnished by one or more functional groups selected from the group consisting of acryloyl (—O—C(=O)CH=CH$_2$), methacryloyl (—O—C(=O)C(CH$_3$)=CH$_2$), maleyl (—O—C(=O)—CH=CH—C(=O)—O—), allyl (—CH$_2$—CH=CH$_2$), propenyl (—CH=CHCH$_3$) and vinyl (—CH=CH$_2$). Salts of (meth)acrylate-functionalized carboxylic acids are utilized in one embodiment of the invention.

In embodiments of the invention where the cation or cations which is or are the counterion(s) to the ethylenically unsaturated carboxylate portion of the salt is or are polyvalent (i.e., has a valency greater than one), the salt may additionally comprise a carboxylate portion that is not ethylenically unsaturated (i.e., does not contain any carbon-carbon double bonds) and/or an ethylenically unsaturated carboxylate portion containing fewer than six carbon atoms (e.g., an acrylate or methacrylate portion). For example, where the salt is a salt of a divalent species such as zinc or calcium, the salt may correspond to the formula MXY, wherein M=Zn or Ca, X=a carboxylate derived from an ethylenically unsaturated carboxylic acid containing six or more carbon atoms and Y=a carboxylate derived from acrylic acid or methacrylic acid.

Furthermore, in embodiments where the cationic portion of the salt is polyvalent, the carboxylate portion may be comprised of a plurality of ethylenically unsaturated carboxylate moieties containing six or more carbon atoms which are the same as or different from each other.

It is also possible to employ ethylenically unsaturated carboxylic acids containing two or more carboxylic acid functional groups per molecule, thereby providing two or more —C(=O)O$^-$ groups which are each ionically bonded with a single polyvalent cation (such as Zn$^{+2}$ or Ca$^{+2}$).

The cation or cations which is or are the counterion(s) in the salt may be provided by any suitable element and may be monovalent (i.e., a valency of one) or polyvalent (i.e., a valency of two, three, four, five, six or more). In one advantageous embodiment, such element is divalent. Suitable elements for use as the cation(s) include both metallic and non-metallic elements and may, for example, be selected from the group consisting of Zn, Ti, Ca, Mg, Al, Zr, Hf, Ga, Cr, La, Ce, Nd, Sm, Gd, Tb, Dy, Ho, Er, Tm, Yb and Lu. Zinc and/or calcium are used in particular embodiments of the invention.

In certain embodiments, the curable compositions of the present invention are characterized by the inclusion of one or more (meth)acrylate salts corresponding to Formula (I) as a polymerizable, ethylenically unsaturated metal complex:

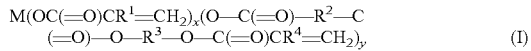  (I)

wherein M is an element other than hydrogen (H) of valence n (e.g., Zn, Ti, Ca, Mg, Al, Zr, Hf, Ga, Cr, La, Ce, Nd, Sm, Gd, Tb, Dy, Ho, Er, Tm, Yb and/or Lu), n=x+y, y=an integer of at least 1, R$^1$ and R$^4$ are the same or different and are H or CH$_3$ and R$^2$ and R$^3$ are the same or different and are divalent organic moieties each containing two or more carbon atoms.

In various embodiments of the invention, R$^2$ may be a cyclohexyl moiety, which may be unsubstituted or substituted with one or more substituents such as an alkyl group (e.g., a C$_1$-C$_6$ alkyl group, e.g., methyl). In one embodiment, R$^2$ is a 1,2-cyclohexyl moiety, which may have one or more substituents, such as alkyl groups, on the cyclohexane ring. In other embodiments, R$^2$ may be an alkylene moiety, which may be substituted or unsubstituted and which may correspond to the general formula —(CH$_2$)$_m$—, wherein m is an integer of 2 or more (e.g., 2-20). In still other embodiments, R$^2$ may be a phenylene moiety, in particular an ortho-phenylene moiety, which may be unsubstituted or substituted with one or more substituents such as an alkyl group (e.g., a C$_1$-C$_6$ alkyl group, e.g., methyl).

In other embodiments, R$^3$ is a branched or linear alkylene moiety, such as, but not limited to, —CH$_2$CH$_2$—, —CH(CH$_3$)CH$_2$— or an oligo-oxyalkylene moiety such as, but limited to, —(CH$_2$CH$_2$O)$_o$CH$_2$CH$_2$— wherein o is an integer of 1 or more (e.g., 1-10). In still other embodiments, R$^3$ may be a substituted alkylene moiety corresponding, for example, to the formula —CH(R$^5$)CH$_2$—, where R$^5$ may be an aryl group (e.g., phenyl or substituted phenyl), aralkyl group (e.g., benzyl), alkyl group (e.g., C$_1$-C$_{20}$ alkyl) or ether-containing hydrocarbyl group (e.g., Ar—O—CH$_2$— or Alk-O—CH$_2$—, where Ar is a substituted or unsubstituted aromatic group such as phenyl and Alk is an alkyl group).

Salts of ethylenically unsaturated carboxylic acids useful as polymerizable, ethylenically unsaturated metal complexes in the present invention are known in the art and are described, for example, in U.S. Pat. Nos. 3,899,382; 6,399,672 and US Pat. Pub. No. 2007/0054969. The disclosure of each of these patent documents is incorporated herein by reference in its entirety for all purposes. Such (meth)acrylate salts are also available from commercial sources, in particular from Sartomer Americas, a business unit of Arkema Inc., located in Exton, Pa. ("Sartomer" herein).

Suitable methods for making such salts comprise reacting a hydroxy-functionalized compound with a carboxylic polyacid or anhydride to form a carboxylic acid-functionalized compound and then reacting that carboxylic acid-functionalized compound with a compound which serves as a source of the cationic portion of the salt. During the latter reaction, the carboxylic acid-functionalized compound is converted to the salt form.

The hydroxy-functionalized compounds used in such preparations can be saturated or unsaturated compounds (i.e., such hydroxy-functionalized compounds may or may not contain one or more carbon-carbon double bonds). Saturated hydroxy-functionalized compounds can be used when the carboxylic polyacid and/or anhydride compound contains ethylenic unsaturation. Unsaturated hydroxy-functionalized compounds can be used when the carboxylic polyacid and/or anhydride compound does not contain ethylenic unsaturation. In other embodiments, both the hydroxy-functionalized compound and the carboxylic polyacid or anhydride compound contain one or more sites of ethylenic unsaturation (one or more carbon-carbon double bonds).

For the hydroxy-functionalized compounds containing an ethylenically unsaturated group, the unsaturation can be provided, for example, by (meth)acryloyl, maleyl, allyl, propenyl and/or vinyl groups. As used herein, the term "(meth)acryloyl" is intended to both include methacryloyl and acryloyl.

Some examples of such suitable hydroxy-functionalized compounds which contain one or more (meth)acrylate functional groups include hydroxyalkyl (meth)acrylates (e.g., hydroxyethyl (meth)acrylate, hydroxypropyl (meth)acrylate, hydroxybutyl (meth)acrylate); alkyl glycidyl (meth)acrylates, aryl glycidyl (meth)acrylates and allyl glycidyl (meth)acrylates that have been ring-opened with hydroxyalkyl (meth)acrylates such as hydroxyethyl (meth)acrylate or hydroxypropyl (meth)acrylate; trimethylolpropane mono- and di-(meth)acrylates; pentaerythritol mono-, di-, and tri-(meth)acrylates; dipentaerythritol mono-, di-, tri-, tetra-, and penta-(meth)acrylates; glycerol mono- and di-(meth)acrylates; neopentyl glycol mono(meth)acrylate; alkylenediol mono(meth)acrylates such as hexanediol mono(meth)acrylate; tris(2-hydroxyethyl)isocyanurate mono- and di-(meth)acrylates; alkoxylated (e.g., ethoxylated or propoxylated) versions of all of the above; polyethylene glycol mono(meth)acrylates; polypropylene glycol mono(meth)acrylates; polyethylene/propylene glycol mono(meth)acrylates; polybutylene glycol mono(meth)acrylates; polytetramethylene glycol mono(meth)acrylates; hydroxy polycaprolactone mono(meth)acrylates and the like and combinations thereof. Residues of these compounds may be represented by $R^3$ in Formulas (I) and (II).

Examples of hydroxy-functionalized compounds which contain one or more allyl groups include allyl alcohol, propoxylated and/or ethoxylated allyl alcohols, cinnamyl alcohol, crotyl alcohol, 3-butene-1-ol, 3-butene-2-ol, linalool, 2-cyclohexen-1-ol, 2-cyclopenten-1-ol, 2-butene-1,4-diol, glycerol mono- and di-allyl ethers, trimethylolpropane mono- and di-allyl ethers and the like.

Other hydroxy-functionalized compounds containing one or more vinyl groups such as, for example, ethylene glycol vinyl ether, propylene glycol vinyl ether, 1,4-butanediol vinyl ether, 1,3-butanediol vinyl ether, 1,6-hexanediol vinyl ether, 2-methyl-1,3-propane diol vinyl ether, di(ethylene glycol) vinyl ether, di(propylene glycol) vinyl ether and the like can also be used.

Carboxylic polyacids or anhydrides which can be reacted with hydroxy-functionalized compounds have either two or more carboxylic acid groups per molecule or at least one anhydride group per molecule or at least one anhydride group and at least one carboxylic group per molecule. The hydroxy-functionalized compound reacts with the carboxylic polyacid or anhydride to form a carboxylic acid-functionalized compound (which in some cases may be considered a "half-ester") which is suitable for reaction with a compound capable of providing the cationic portion of the salt (e.g., a metal compound, such as a metal oxide, for example zinc oxide). The carboxy equivalent functionality of suitable carboxylic polyacids and anhydrides may be about 2-30, preferably, 2-6.

Suitable compounds containing anhydride and/or carboxylic acid groups which react with the hydroxy-functionalized compounds include aromatic and aliphatic compounds such as phthalic anhydride, isophthalic acid, terephthalic acid, tetrabromophthalic anhydride, tetrahydrophthalic anhydride, hexahydrophthalic anhydride (1,2-cyclohexanedicarboxylic anhydride) and alkyl-substituted analogues thereof, itaconic anhydride, itaconic acid, phthalic acid, trimellitic anhydride (which contains one anhydride and one carboxyl group), pyromellitic dianhydride, 5-norbornene-endo-2,3-dicarboxylic anhydride, naphthyl anhydride, naphthalene tetracarboxylic acid dianhydride, maleic anhydride, citraconic anhydride, diphenic anhydride, succinic anhydride, chlorendic anhydride, maleic acid, succinic acid, fumaric acid, oxalic acid, malonic acid, glutaric acid, glutaric anhydride, adipic acid, dimer fatty acids, hexahydrotrimellitic anhydride, biphenyl tetracarboxylic acid dianhydrides, diphthalic anhydrides, homophthalic anhydride, aconitic anhydride, benzophenone tetracarboxylic acid dianhydrides, styrene/maleic anhydride oligomers and polymers and (meth)acrylic acid oligomers, polymers and co-polymers.

Suitable compounds capable of providing the cationic portion of the salt when reacted with the hydroxy-functionalized compound/carboxylic polyacid and/or anhydride reaction products (e.g., half esters) prepared as described above include both metallic and non-metallic compounds. Suitable compounds for this purpose include compounds containing one or more elements selected from Zn, Ti, Ca, Mg, Al, Zr, Hf, Ga, Cr, La, Ce, Nd, Sm, Gd, Tb, Dy, Ho, Er, Tm, Yb and Lu and the like. The compounds can be, for example, oxides, halides, alkoxides, hydroxides, nitrates, sulfates, carboxylates and carbonates of the aforementioned elements. The most preferred compound for reaction with the hydroxy-functionalized compound/polycarboxylic acid and/or anhydride reaction products is zinc oxide, since it reacts very easily and is readily available.

One suitable method of making salts of ethylenically unsaturated carboxylic acids suitable for use as polymerizable, ethylenically unsaturated metal complexes in the present invention involves reacting an M-containing compound with a carboxylic acid corresponding to Formula (II), which may be considered a "half-ester":

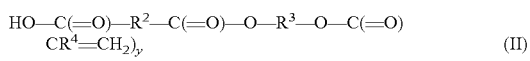

$$HO-C(=O)-R^2-C(=O)-O-R^3-O-C(=O)\\CR^4=CH_2)_y \quad (II)$$

The M-containing compound serves as the source of M in the (meth)acrylate salt of Formula (I). That is, suitable M-containing compounds include those compounds capable of reacting with the carboxylic acid of Formula (II) and which can provide one or more M ions when reacted with a carboxylic acid of Formula (II). Suitable M-containing compounds may, in various embodiments of the invention, be selected from the group consisting of M-containing oxides, M-containing halides, M-containing alkoxides, M-containing hydroxides, M-containing nitrates, M-containing sulfates, M-containing carboxylates, M-containing carbonates and combinations thereof. For example, the M-containing compound may correspond to the formula $M(X)_n$, wherein each X is independently oxygen, halide, alkoxide, hydroxide, nitrate, sulfate, carboxylate, carbonate or combinations thereof if more than one X is present, and n=the valency of M. M-containing oxides in particular may be used, especially zinc oxide or calcium oxide.

In other embodiments of the invention, the at least one polymerizable, ethylenically unsaturated metal complex includes at least one polymerizable, ethylenically unsaturated metal complex comprised of an ethylenically unsaturated beta-diketonate ligand. The ethylenic unsaturation in such ligands may be provided by an acrylate, methacrylate or allyl functional group, for example. Suitable ethylenically unsaturated beta-diketonate ligands include, for example, acetoacetoxy functional compounds represented by Formula (III):

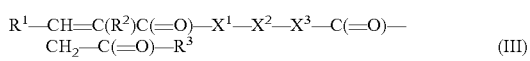

$$R^1-CH=C(R^2)C(=O)-X^1-X^2-X^3-C(=O)-\\CH_2-C(=O)-R^3 \quad (III)$$

where $R^1$ is a hydrogen or halogen; $R^2$ is a hydrogen, halogen, $C_1$-$C_6$ alkylthio group or $C_1$-$C_6$ alkyl group; $R^3$ is a $C_1$-$C_6$ alkyl group; $X^1$ and $X^3$ are independently O, S or a group of the formula: $-N(R^4)-$, where $R^4$ is a $C_1$-$C_6$ alkyl group; $X^2$ is a $C_2$-$C_{12}$ alkylene group or $C_3$-$C_{12}$ cycloalkylene group. The alkyl and alkylene group(s) may be straight (linear) or branched.

Suitable ethylenically unsaturated beta-diketonate ligands are also described in U.S. Pat. No. 3,459,790 and WO 2012/082348 A1, the disclosures of which are incorporated herein by reference in their entirety for all purposes.

Preferred ligands of Formula (III) are acetoacetoxyethyl (meth)acrylate, acetoacetoxy (methyl)ethyl (meth)acrylate, acetoacetoxypropyl (meth)acrylate, 2,3-di(acetoacetoxy) propyl (meth)acrylate and acetoacetoxybutyl (meth)acrylate. Acetoacetoxyethyl (meth)acrylate (AAEM) is a particularly preferred ligand of Formula (III).

Ethylenically unsaturated metal complexes useful in the present invention also include metal complexes comprised of at least one ethylenically unsaturated beta-diketoamide ligand such as those described in U.S. Pat. Nos. 4,215,195 and 5,872,297 (the entire disclosures of which are incorporated herein by reference for all purposes). Acetoacetamidoethyl methacrylate is an example of such an ethylenically unsaturated beta-diketoamide ligand.

Metal complexes comprised of one or more ethylenically unsaturated beta-diketonates and/or ethylenically unsaturated beta-diketamides may be prepared by any suitable method, including for example by reacting a metal-containing compound (e.g., a Zn-, Ti-, Ca-, Mg-, Al-, Zr-, Hf-, Ga-, Cr-, La-, Ce-, Nd-, Sm-, Gd-, Tb-, Dy-, Ho-, Er-, Tm, Yb- and/or Lu-containing compound). Suitable metal-containing compounds may, in various embodiments of the invention, be selected from the group consisting of metal-containing oxides, metal-containing halides, metal-containing alkoxides, metal-containing hydroxides, metal-containing nitrates, metal-containing sulfates, metal-containing carboxylates, metal-containing carbonates and combinations thereof. For example, the metal-containing compound may correspond to the formula $M(X)_n$, wherein M is a metal (e.g., Zn, Ti, Ca, Mg, Al, Zr, Hf or Ga) each X is independently oxygen, halide, alkoxide, hydroxide, nitrate, sulfate, carboxylate, carbonate or combinations thereof if more than one X is present and n=the valency of M. Metal-containing oxides in particular may be used, especially zinc oxide or calcium oxide. One or more other compounds may additionally be present during such reaction such as, for example, a carboxylic acid (e.g., an ethylenically unsaturated carboxylic acid).

The amount of polymerizable, ethylenically unsaturated metal complex present in the curable compositions of the present invention is not believed to be particularly critical and may be readily varied as may be desired depending upon parameters such as, for example, the identity or identities of the polymerizable, ethylenically unsaturated metal complex(es), the nature of the other components of the curable composition and the desired properties or attributes of the cured composition and the cured composition obtained therefrom. According to certain embodiments, however, polymerizable, ethylenically unsaturated metal complex (either a single species or a combination of different metal complexes) is the predominant component of the curable composition; that is, more polymerizable, ethylenically unsaturated metal complex is present, by weight, than any other type of component. However, in other embodiments, a smaller relative weight proportion of polymerizable, ethylenically unsaturated metal complex is used. For example and without limitation, the curable composition may be comprised of from 5% to 70%, preferably from 5% to 20%, more preferably from 7% to 15% by weight, in total, of polymerizable, ethylenically unsaturated metal complex.

Polymerizable, Ethylenically Unsaturated Compounds other than Polymerizable, Ethylenically Unsaturated Metal Complexes Polymerizable, ethylenically unsaturated compounds suitable for use in combination with the above-described ethylenically unsaturated metal complexes include compounds containing at least one carbon-carbon double bond, in particular a carbon-carbon double bond capable of participating in a free radical reaction wherein at least one carbon of the carbon-carbon double bond becomes covalently bonded to an atom, in particular a carbon atom, in a second molecule. Such reactions may result in a polymerization or curing whereby the ethylenically unsaturated compound becomes part of a polymerized matrix or polymeric chain. In various embodiments of the invention, the additional ethylenically unsaturated compound(s) may contain one, two, three, four, five or more carbon-carbon double bonds per molecule. Combinations of multiple ethylenically unsaturated compounds containing different numbers of carbon-carbon double bonds may be utilized in the curable compositions of the present invention. The carbon-carbon double bond may be present as part of an $\alpha,\beta$-unsaturated carbonyl moiety, e.g., an $\alpha,\beta$-unsaturated ester moiety such as an acrylate functional group or a methacrylate functional group or an $\alpha,\beta$-unsaturated amide moiety such as an acrylamide functional group or a methacrylamide functional group. A carbon-carbon double bond may also be present in the additional ethylenically unsaturated compound in the form of a vinyl group —CH=$CH_2$ (such as an allyl group, —$CH_2$—CH=$CH_2$). Two or more different types of functional groups containing carbon-carbon double bonds may be present in the additional ethylenically unsaturated compound. For example, the ethylenically unsaturated compound may contain two or more functional groups selected from the group consisting of vinyl groups (including allyl groups), acrylate groups, methacrylate groups, acrylamide groups, methacrylamide groups and combinations thereof.

The curable compositions of the present invention may, in particularly preferred embodiments, contain one or more (meth)acrylate functional compounds capable of undergoing free radical polymerization (curing), in addition to one or more polymerizable, ethylenically unsaturated metal complexes as described herein. As used herein, the term "(meth)acrylate" refers to methacrylate (—O—C(=O)—C($CH_3$)=$CH_2$) as well as acrylate (—O—C(=O)—CH=$CH_2$) functional groups. Suitable free radical-curable (meth)acrylates include compounds containing one, two, three, four or more (meth)acrylate functional groups per molecule; the free radical-curable (meth)acrylates may be oligomers or monomers. The at least one additional ethylenically unsaturated monomer or oligomer may include, for example, at least one compound selected from the group consisting of cyclic, linear and branched mono-, di- and tri-(meth)acrylate-functionalized monomers and oligomers.

The amount in the curable composition of additional polymerizable, ethylenically unsaturated compound relative to the amount of polymerizable, ethylenically unsaturated metal complex is not believed to be critical and may be selected or controlled as may be appropriate or desired to attain certain properties in the curable composition or the cured resin obtained therefrom.

Suitable free (meth)acrylate oligomers include, for example, polyester (meth)acrylates, epoxy (meth)acrylates, polyether (meth)acrylates, polyurethane (meth)acrylates, acrylic (meth)acrylate oligomers, epoxy-functional (meth)acrylate oligomers and combinations thereof. Such oligomers may be selected and used in combination with the polymerizable, ethylenically unsaturated metal complex(es) and polymerizable, heterocyclic moiety-containing compound(s) in order to enhance the flexibility, strength and/or modulus, among other attributes, of a cured composition prepared using the curable composition of the present invention.

Exemplary polyester (meth)acrylates include the reaction products of acrylic or methacrylic acid or mixtures thereof with hydroxyl group-terminated polyester polyols. The reaction process may be conducted such that a significant concentration of residual hydroxyl groups remain in the polyester (meth)acrylate or may be conducted such that all or essentially all of the hydroxyl groups of the polyester polyol have been (meth)acrylated. The polyester polyols can be made by polycondensation reactions of polyhydroxyl functional components (in particular, diols) and polycarboxylic acid functional compounds (in particular, dicarboxylic acids and anhydrides). The polyhydroxyl functional and polycarboxylic acid functional components can each have linear, branched, cycloaliphatic or aromatic structures and can be used individually or as mixtures.

Examples of suitable epoxy (meth)acrylates include the reaction products of acrylic or methacrylic acid or mixtures thereof with glycidyl ethers or esters.

Suitable polyether (meth)acrylates include, but are not limited to, the condensation reaction products of acrylic or methacrylic acid or mixtures thereof with polyetherols which are polyether polyols. Suitable polyetherols can be linear or branched substances containing ether bonds and terminal hydroxyl groups. Polyetherols can be prepared by ring opening polymerization of cyclic ethers such as tetrahydrofuran or alkylene oxides with a starter molecule. Suitable starter molecules include water, hydroxyl functional materials, polyester polyols and amines.

Polyurethane (meth)acrylates (sometimes also referred to as "urethane (meth)acrylates") capable of being used in the curable compositions of the present invention include urethanes based on aliphatic and/or aromatic polyester polyols and polyether polyols and aliphatic and/or aromatic polyester diisocyanates and polyether diisocyanates capped with (meth)acrylate end-groups. Suitable polyurethane (meth)acrylates include, for example, aliphatic polyester-based urethane diacrylate oligomers, aliphatic polyether-based urethane diacrylate oligomers, as well as aliphatic polyester/polyether-based urethane diacrylate oligomers. Aliphatic polyurethane acrylate oligomers useful in the present invention are commercially available from Sartomer (Exton, Pa.), such as the products sold under the designations CN983, CN9001 and CN9004.

In various embodiments, the polyurethane (meth)acrylates may be prepared by reacting aliphatic and/or aromatic diisocyanates with OH group terminated polyester polyols (including aromatic, aliphatic and mixed aliphatic/aromatic polyester polyols), polyether polyols, polycarbonate polyols, polycaprolactone polyols, polydimethysiloxane polyols or polybutadiene polyols or combinations thereof to form isocyanate-functionalized oligomers which are then reacted with hydroxyl-functionalized (meth)acrylates such as hydroxyethyl acrylate or hydroxyethyl methacrylate to provide terminal (meth)acrylate groups. For example, the polyurethane (meth)acrylates may contain two, three, four or more (meth)acrylate functional groups per molecule.

One or more urethane diacrylates are employed in certain embodiments of the invention. For example, the curable composition may comprise (in addition to polymerizable, ethylenically unsaturated metal complex and polymerizable, heterocyclic moiety-containing compound) at least one urethane diacrylate comprising a difunctional aromatic urethane acrylate oligomer, a difunctional aliphatic urethane acrylate oligomer and combinations thereof. In certain embodiments, a difunctional aromatic urethane acrylate oligomer, such as that available from Sartomer (Exton, Pa.) under the trade name CN9782, may be used as the at least one urethane diacrylate. In other embodiments, a difunctional aliphatic urethane acrylate oligomer, such as that available from Sartomer under the trade name CN9023, may be used as the at least one urethane diacrylate. CN9782, CN9023, CN978, CN965, CN9031, CN8881 and CN8886, all available from Sartomer, may all be advantageously employed as urethane diacrylates in the compositions of the present invention.

Suitable acrylic (meth)acrylate oligomers (sometimes also referred to in the art as "acrylic oligomers") include oligomers which may be described as substances having an oligomeric acrylic backbone which is functionalized with one or (meth)acrylate groups (which may be at a terminus of the oligomer or pendant to the acrylic backbone). The acrylic backbone may be a homopolymer, random copolymer or block copolymer comprised of repeating units of acrylic monomers. The acrylic monomers may be any monomeric (meth)acrylate such as $C_1$-$C_6$ alkyl (meth)acrylates as well as functionalized (meth)acrylates such as (meth)acrylates bearing hydroxyl, carboxylic acid and/or epoxy groups. Acrylic (meth)acrylate oligomers may be prepared using any procedures known in the art such as oligomerizing monomers, at least a portion of which are functionalized with hydroxyl, carboxylic acid and/or epoxy groups (e.g., hydroxyalkyl(meth)acrylates, (meth)acrylic acid, glycidyl (meth)acrylate) to obtain a functionalized oligomer intermediate, which is then reacted with one or more (meth)acrylate-containing reactants to introduce the desired (meth)acrylate functional groups. Suitable acrylic (meth)acrylate oligomers are commercially available from Sartomer under products designated as CN820, CN821, CN822 and CN823, for example.

Polymerizable, ethylenically unsaturated compounds which are monomers suitable for use in the present invention include the following types of monomers (wherein "functional" refers to the number of (meth)acrylate functional groups per molecule, e.g., mono functional=one (meth)acrylate group per molecule, difunctional=two (meth)acrylate groups per molecule):

i) cyclic mono functional (meth)acrylate monomers, such as isobornyl (meth)acrylate, cyclohexyl (meth)acrylate, 4-tert-butyl cyclohexyl (meth)acrylate and alkoxylated analogues thereof;

ii) linear and branched mono functional (meth)acrylate monomers, such as isodecyl (meth)acrylate, ethoxyethoxyethyl (meth)acrylate, polyethylene mono (meth)acrylates, neopentyl glycol (meth)acrylates and alkoxylated analogues thereof, as well as caprolactone-based (meth)acrylates prepared by addition of one, two, three or more moles of caprolactone to a hydroxyalkyl (meth)acrylate such as hydroxyethyl (meth)acrylate ("caprolactone adducts of hydroxyalkyl (meth)acrylates");

iii) cyclic difunctional (meth)acrylate monomers, such as tricyclodecane dimethanol di(meth)acrylate, cyclohexane dimethanol di(meth)acrylate and alkoxylated analogues thereof;

iv) linear difunctional (meth)acrylate monomers, such as polyethylene di(meth)acrylates, neopentyl glycol di(meth)acrylates and alkoxylated analogues thereof; and v) trifunctional (meth)acrylate monomers, such as triallyl isocyanurate tri(meth)acrylates, trimethylol tri(meth)acrylates and alkoxylated analogues thereof.

Such monomers may be used to reduce the viscosity of the curable compositions of the present invention and adjust the flexibility, strength and/or modulus, among other properties, of finished articles obtained by curing the compositions.

Illustrative examples of suitable polymerizable, ethylenically unsaturated monomers containing (meth)acrylate functionality include 1,3-butylene glycol di(meth)acrylate, butanediol di(meth)acrylate, 1,6-hexanediol di(meth)acrylate, alkoxylated hexanediol di(meth)acrylate, alkoxylated aliphatic di(meth)acrylate, alkoxylated neopentyl glycol di(meth)acrylate, dodecyl di(meth) acrylate cyclohexane dimethanol di(meth)acrylate, diethylene glycol di(meth) acrylate, dipropylene glycol di(meth)acrylate, n-alkane di(meth) acrylate, polyether di(meth) acrylates, ethoxylated bisphenol A di(meth)acrylate, ethylene glycol di(meth)acrylate, neopentyl glycol di(meth)acrylate, polyester di(meth)acrylate, polyethylene glycol di(meth)acrylate, polypropylene glycol di(meth)acrylate, propoxylated neopentyl glycol diacrylate, tricyclodecane dimethanol diacrylate, triethylene glycol di(meth)acrylate, tetraethylene glycol di(meth)acrylate tripropylene glycol di(meth)acrylate, ditrimethylolpropane tetra(meth)acrylate, dipentaerythritol penta(meth)acrylate, ethoxylated pentaerythritol tetra(meth)acrylate, dipentaerythritol penta(meth)acrylate, dipentaerythritol penta(meth)acrylate, penta(meth)acrylate ester, pentaerythritol tetra(meth)acrylate, ethoxylated trimethylolpropane tri (meth)acrylate, alkoxylated trimethylolpropane tri(meth) acrylate, highly propoxylated glyceryl tri(meth)acrylate, trimethylolpropane tri(meth)acrylate, trimethylolpropane tri (meth)acrylate, pentaerythritol tri(meth)acrylate, propoxylated glyceryl tri(meth)acrylate, propoxylated trimethylolpropane tri(meth)acrylate, trimethylolpropane trimethacrylate, tris (2-hydroxy ethyl) isocyanurate tri (meth)acrylate, 2(2-ethoxyethoxy) ethyl (meth)acrylate, 2-phenoxyethyl (meth)acrylate, 3,3,5-trimethylcyclohexyl (meth)acrylate, alkoxylated lauryl (meth)acrylate, alkoxylated phenol (meth)acrylate, alkoxylated tetrahydrofurfuryl (meth)acrylate, caprolactone (meth)acrylate, (meth)acryloxyethyl di(caprolactone), cyclic trimethylolpropane formal (meth)acrylate, cycloaliphatic acrylate monomer, dicyclopentadienyl (meth)acrylate, diethylene glycol methyl ether (meth)acrylate, ethoxylated (4) nonyl phenol (meth) acrylate, ethoxylated nonyl phenol (meth)acrylate, isobornyl (meth)acrylate, isodecyl (meth)acrylate, isooctyl (meth) acrylate, lauryl (meth)acrylate, methoxy polyethylene glycol (meth)acrylate, octyldecyl (meth)acrylate, stearyl (meth) acrylate, tetrahydrofurfuryl (meth) acrylate, tridecyl (meth) acrylate and/or triethylene glycol ethyl ether (meth)acrylate, t-butyl cyclohexyl (meth)acrylate, alkyl (meth)acrylate, dicyclopentadiene di(meth)acrylate, alkoxylated nonylphenol (meth)acrylate, phenoxyethanol (meth)acrylate, octyl (meth)acrylate, decyl (meth)acrylate, dodecyl (meth)acrylate, tetradecyl (meth)acrylate, tridecyl (meth)acrylate, cetyl (meth)acrylate, hexadecyl (meth)acrylate, behenyl (meth) acrylate, diethylene glycol ethyl ether (meth)acrylate, diethylene glycol butyl ether (meth)acrylate, triethylene glycol methyl ether (meth)acrylate, dodecanediol di (meth)acrylate, dodecane di (meth)acrylate, dipentaerythritol penta/hexa(meth)acrylate, pentaerythritol tetra(meth)acrylate, ethoxylated pentaerythritol tetra(meth)acrylate, ethoxylated trimethylolpropane tri(meth)acrylate, trimethylolpropane tri (meth)acrylate, di-trimethylolpropane tetra(meth)acrylate, propoxylated glyceryl tri(meth)acrylate, pentaerythritol tri (meth)acrylate, propoxylated glyceryl tri(meth)acrylate, propoxylated trimethylolpropane tri(meth)acrylate, trimethylolpropane tri(meth)acrylate and tris (2-hydroxy ethyl) isocyanurate tri(meth)acrylate (also known as tris((meth) acryloxyethyl)isocyanurate), tricyclodecane methanol (meth)acrylate, glycerol carbonate (meth)acrylate and combinations thereof.

According to certain embodiments, the curable composition is comprised of at least one polymerizable, ethylenically unsaturated compound (other than polymerizable, ethylenically unsaturated metal complex) that contains at least one hydroxyl group per molecule. Examples of such hydroxyl group-containing ethylenically unsaturated compounds include, but are not limited to, caprolactone adducts of hydroxyalkyl (meth)acrylates (compounds corresponding to the general formula $H_2C=C(R)-C(=O)-O-R^1-(OC(=O)-[(CH_2)_5]_nOH$, wherein R=H, $CH_3$, $R^1=C_2-C_4$ alkylene, such as ethylene, propylene, butylene and n=1-10, e.g., acryloxyethyl di(caprolactone)), hydroxyalkyl (meth) acrylates, alkoxylated (e.g., ethoxylated and/or propoxylated) hydroxyalkyl (meth)acrylates (including mono(meth) acrylates of ethylene glycol and propylene glycol oligomers and polymers) and the like.

The amount of polymerizable, ethylenically unsaturated compound other than polymerizable, ethylenically unsaturated metal complex which may be present in the curable compositions of the present invention is not believed to be particularly critical and may be readily varied as may be desired depending upon parameters such as, for example, the identity or identities of the polymerizable, ethylenically unsaturated compound(s), the nature of the other components of the curable composition and the desired properties or attributes of the curable composition and the cured composition obtained therefrom. For example and without limitation, the curable composition may be comprised of from 15% to 60% by weight, preferably 20 to 50% and most preferably 25 to 45% by weight, in total, of polymerizable, ethylenically unsaturated compound.

In addition to (or in replacement of) polymerizable, ethylenically unsaturated compounds, it is also possible for the curable composition to comprise at least one polymerizable compound that does not contain any polymerizable sites of ethylenic unsaturated, but that does contain at least one reactive functional group other than an ethylenically unsaturated functional group. Such reactive functional groups include, for example, hydroxyl groups. Suitable types of polymerizable compounds containing one, two, three or more reactive groups include, without limitation, glycols such as ethylene glycol and butylene glycol, polyether polyols and polyester polyols, for instance. As explained in further detail below one or more of the polymerizable heterocyclic moiety-containing compounds present in the curable composition may also contain one or more reactive functional groups other than ethylenically unsaturated functional groups, such as hydroxy-functionalized epoxides, hydroxyl-functionalized oxetanes, hydroxy-functionalized cyclic carbonates, hydroxy-functionalized lactides and hydroxy-functionalized lactones.

Polymerizable Heterocyclic Moiety-Containing Compounds

The curable compositions of the present invention contain one or more polymerizable, heterocyclic moiety-containing compounds. Such compounds are capable of participating in curing of the curable composition by reaction of one or more of the heterocyclic moieties (heterocyclic functional groups) present in the compounds, typically involving a ring-opening reaction or polymerization. The heterocyclic moiety or moieties may be any of the moieties known in the art to be capable of such reactions, such as a ring structure containing at least one heteroatom such as an oxygen atom. Typically, the heterocyclic ring is a three to six membered ring. Suitable heterocyclic moieties include, for example, epoxy groups (where the heterocyclic ring contains two carbon atoms and an oxygen atom), oxetane groups (where the heterocyclic ring contains three carbon atoms and an oxygen atoms), cyclic carbonate groups (wherein the heterocyclic ring contains, for example, three carbon atoms and two oxygen atoms on either side of a carbon atom which is also part of a carbonyl group) and lactone groups (wherein the heterocyclic group contains, for example three to five carbon atoms and one oxygen atom which is adjacent to a carbon atom which is also part of a carbonyl group). Thus, the curable composition may comprise at least one polymerizable heterocyclic moiety-containing compound selected from the group consisting of epoxides, oxetanes, cyclic carbonates, lactides and lactones. According to one embodiment of the invention, only one type of polymerizable heterocyclic moiety-containing compound is present. In other embodiments, two or more types of polymerizable heterocyclic moiety-containing compounds are present. A heterocyclic moiety-containing compound may contain two or more different types of polymerizable heterocyclic rings. For example, a heterocyclic moiety-containing compound may contain one or more oxetane rings and one or more epoxy rings (3-[(oxiranylmethoxy)methyl] oxetane is an example of such a compound).

The curable composition, in certain embodiments, may comprise at least one polymerizable, heterocyclic moiety-containing compound that comprises, in addition to at least one polymerizable heterocyclic ring (such as an epoxy or oxetane group), at least one polymerizable site of ethylenic unsaturation, such as may be supplied by a (meth)acrylate group, a (meth)acrylamide group, a vinyl group, an allyl group or the like. Glycidyl methacrylate, glycidyl acrylate and (3-ethyloxetane-3-yl) methyl (meth)acrylate are specific examples of such a polymerizable, heterocyclic moiety-containing compound.

Exemplary epoxides suitable for use in the present invention include mono-epoxides, di-epoxides and poly-epoxides (compounds containing three or more epoxy groups per molecule). Alicyclic polyglycidyl compounds and cycloaliphatic polyepoxides are two classes of suitable epoxides. Such compounds contain two or more epoxide groups per molecule and may have a cycloaliphatic ring structure that contains the epoxide groups as side groups (pendant to the cycloaliphatic ring) or may have a structure where the epoxide groups are part of an alicyclic ring structure.

Examples of compounds in which the epoxide groups form part of an alicyclic ring system include bis(2,3-epoxycyclopentyl)ether; 2,3-epoxycyclopentyl glycidyl ether, 1,2-bis(2,3-epoxycyclopentyloxy)ethane; bis(4-hydroxycyclohexyl)methane diglycidyl ether, 2,2-bis(4-hydroxycyclohexyl)propane diglycidyl ether; 3,4-epoxycyclohexylmethyl-3',4'-epoxycyclohexanecarboxylate; 3,4-epoxy-6-methyl-cyclohexylmethyl 3,4-epoxy-6-methylcyclohexanecarboxylate; di(3,4-epoxycyclohexylmethyl)hexanedioate; di(3,4-epoxy-6-methylcyclohexylmethyl)hexanedioate; ethylenebis(3,4-epoxycyclohexane-carboxylate, ethanediol di(3,4-epoxycyclohexylmethyl)ether; vinylcyclohexene dioxide; dicyclopentadiene diepoxide and 2-(3,4-epoxycyclohexyl-5, 5-spiro-3,4-epoxy-)cyclohexane-1,3-dioxane.

Suitable illustrative mono-epoxides include: glycidyl (meth)acrylate and (3,4-epoxycyclohexyl)methyl(meth) acrylate as well as other mono-epoxide compounds containing an epoxy group and a (meth)acrylate group.

Suitable illustrative di-epoxides include diglycidyl ethers of dialcohols and diglycidyl esters of di-acids such as: ethylene glycol diglycidyl ether, oligo- and polyethylene glycol diglycidyl ethers, propylene glycol diglycidyl ether, oligo- and polypropylene glycol diglycidyl ethers, butanediol diglycidyl ether, alkoxylated (e.g., ethoxylated, propoxylated) butanedioldiglycidyl ethers, neopentyl glycol diglycidyl ether, alkoxylated (e.g., ethoxylated, propoxylated) neopentyl glycol diglycidyl ethers, hexanediol diglycidyl ether, alkoxylated (e.g., ethoxylated, propoxylated) hexanediol diglycidyl ethers, cyclohexanedimethanol diglycidyl ether, alkoxylated (e.g., ethoxylated, propoxylated) cyclohexanedimethanol diglycidyl ethers, hydrogenated or nonhydrogenated bisphenol A diglycidyl ethers (BADGE), hydrogenated or nonhydrogenated bisphenol F diglycidyl ethers (BFDGE), diglycidyl ethers of alkoxylated (e.g., ethoxylated, propoxylated) bisphenols (such as bisphenol A or bisphenol F or hydrogenated derivatives thereof), diglycidyl esters of ortho-, iso- or terephthalic acid, diglycidyl esters of tetrahydrophthalic acid and diglycidyl esters of hexahydrophthalic acid.

Suitable illustrative poly-epoxides include glycidyl ethers of compounds having three or more hydroxyl groups, such as hexane-2,4,6-triol; glycerol; 1,1,1-trimethylol propane; bistrimethylol propane; pentaerythritol; sorbitol and alkoxylated (e.g., ethoxylated, propoxylated) derivatives thereof, epoxy novolac resins and the like.

Suitable illustrative oxetanes include oxetane itself and substituted derivatives thereof, provided the substituents do not interfere with the desired reaction/polymerization/curing of the oxetane. The substituent(s) may be, for example, alkyl groups, hydroxyalkyl groups, halo, haloalkyl groups, aryl groups, aralkyl groups and the like. The oxetane may be a mono-oxetane (a compound containing a single oxetane ring), a di-oxetane (a compound containing two oxetane rings), a tri-oxetane (a compound containing three oxetane rings) or an oxetane compound containing four or more oxetane rings. Examples of suitable oxetanes include, but are not limited to, oxetane, trimethyolpropane oxetane, 3-ethyl-3-hydroxymethyl oxetane, 1,4-bis[(3-ethyl-3-oxetanylmethoxy)methyl]benzene, 3-ethyl-3-phenoxymethyl oxetane, bis[(1-ethyl(3-oxetanyl))methyl] ether, 3,3-bis (chloromethyl oxetane), 3,3-bis (iodomethyl) oxetane, 3,3-bis(methoxymethyl) oxetane, 3,3-bis(phenoxymethyl) oxetane, 3-methyl-3-chloromethyl oxetane, 3,3-bis(acetoxymethyl) oxetane, 3,3-bis (fluoromethyl) oxetane, 3,3-bis (bromomethyl) oxetane, 3,3-dimethyl oxetane, 3,3'-[1,4-phenylenebis(methyleneoxymethylene)]bis[3-ethyloxetane], 3-ethyl-3-[[(2-ethylhexyl)oxy]methyl] oxetane and the like and combinations thereof. Additional examples of suitable oxetanes are described in the following patent documents, the disclosures of each of which are incorporated herein by reference in its entirety for all purposes: U.S. Pat. Publication No. 2010/0222512 A1, U.S. Pat. Nos. 3,835,003, 5,750,590, 5,674,922, 5,981,616, 6,469,108 and 6,015,914. Suitable oxetanes are available from commercial sources, such as the oxetanes sold by the Toagosei Corporation under the tradenames OXT-221, OXT-121, OXT-101, OXT-212, OXT-211, CHOX, OX-SC and PNOX-1009.

Suitable illustrative cyclic carbonates include five- and six-membered ring cyclic carbonates such as ethylene carbonate, propylene carbonate, trimethylene carbonate, vinylene carbonate as well as carbonate esters of 1,2- and 1,3-dialcohols generally, particularly aliphatic 1,2- and 1,3-dialcohols.

Suitable illustrative lactides include the cyclic diesters of 2-hydroxycarboxylic acids such as 2-hydroxypropionic acid (lactic acid). L-lactide, D-lactide and DL-lactide may all be used, for example.

Suitable illustrative lactones include cyclic esters of hydroxycarboxylic acids, particularly 4- to 7-membered lactones such as β-propiolactones, γ-buyrolactones, δ-valerolactones and ε-caprolactones.

According to one aspect of the invention, at least one polymerizable, heterocyclic moiety-containing compound is present in the curable composition that contains (in addition to at least one polymerizable heterocyclic group) at least one hydroxyl group. For example, a hydroxyl-substituted oxetane and/or hydroxyl-substituted epoxide may be utilized.

In one advantageous embodiment, the curable composition comprises a) at least one epoxide and/or hydroxy-functionalized compound and b) at least one cyclic carbonate. The use of both a) and b) types of compounds has been found to help reduce the stiffness of the composition once it is thermally cured, thus offering a possible route to low modulus materials. For example, epoxide and cyclic carbonate may be present in the curable composition in a weight ratio of epoxide:cyclic carbonate of from 1:99 to 9:1. As another example, hydroxy-functionalized compound and cyclic carbonate may be present in the curable composition in a weight ratio of hydroxy-functionalized compound: cyclic carbonate of from 1:9 to 9:1.

The amount of polymerizable, heterocyclic moiety-containing compound present in the curable compositions of the present invention is not believed to be particularly critical and may be readily varied as may be desired depending upon parameters such as, for example, the identity or identities of the polymerizable, heterocyclic moiety-containing compound(s), the nature of the other components of the curable composition and the desired properties or attributes of the cured composition and the cured composition obtained therefrom. For example and without limitation, the curable composition may be comprised of from 20% to 60%, preferably 35% to 60% and most preferably 50% to 60% by weight, in total, of polymerizable, heterocyclic moiety-containing compound.

Initiators

In certain embodiments of the invention, the curable compositions described herein include at least one photoinitiator and are curable with radiant energy. For example, the photoinitiator(s) may be selected from the group consisting of α-hydroxyketones, phenylglyoxylates, benzyldimethyl-ketals, α-aminoketones, mono-acyl phosphines, bis-acyl phosphines, phosphine oxides and combinations thereof (such as blends of alpha hydroxyl ketone and acyl phosphine oxide). In particular embodiments, the at least one photoinitiator may be 1-hydroxy-cyclohexyl-phenyl-ketone and/or 2-hydroxy-2-methyl-1-phenyl-1-propanone. In other embodiments, the at least one photoinitiator is or includes a phosphine oxide, in particular bis(2,4-6-trimethylbenzoyl) phenyl phosphine oxide, (2,4,6-trimethylbenzoyl)phenylethoxy phosphine oxide, tris(2,4,6-trimethylbenzoyl)phosphine oxide and liquid mixtures thereof.

Suitable photoinitiators include, but are not limited to, 2-methylanthraquinone, 2-ethylanthraquinone, 2-chloroanthraquinone, 2-benzyanthraquinone, 2-t-butylanthraquinone, 1,2-benzo-9,10-anthraquinone, benzyl, benzoin, benzoin methyl ether, benzoin ethyl ether, benzoin isopropyl ether, alpha-methylbenzoin, alpha-phenylbenzoin, Michler's ketone, benzophenone, 4,4'-bis-(diethylamino) benzophenone, acetophenone, 2,2-diethyloxyacetophenone, diethyloxyacetophenone, 2-isopropylthioxanthone, thioxanthone, diethyl thioxanthone, 1,5-acetonaphthylene, ethyl-p-dimethylaminobenzoate, benzil ketone, α-hydroxy keto, 2,4,6-trimethylbenzoyldiphenyl phosphine oxide, benzyl dimethyl ketal, benzil ketal (2,2-dimethoxy-1,2-diphenylethanone), 1-hydroxycylcohexyl phenyl ketone, 2-methyl-1-[4-(methylthio) phenyl]-2-morpho linopropanone-1, 2-hydroxy-2-methyl-1-phenyl-propanone, oligomeric α-hydroxy ketone, phenylbis(2,4,6-trimethylbenzoyl)phosphine oxide, ethyl-4-dimethylamino benzoate, ethyl(2,4,6-trimethylbenzoyl)phenyl phosphinate, anisoin, anthraquinone, anthraquinone-2-sulfonic acid, sodium salt monohydrate, (benzene) tricarbonylchromium, benzil, benzoin isobutyl ether, benzophenone/1-hydroxycyclohexyl phenyl ketone, 50/50 blend, 3,3',4,4'-benzophenonetetracarboxylic dianhydride, 4-benzoylbiphenyl, 2-benzyl-2-(dimethylamino)-4'-morpholinobutyrophenone, 4,4'-bis(diethylamino)benzophenone, 4,4'-bis(dimethylamino)benzophenone, camphorquinone, 2-chlorothioxanthen-9-one, dibenzosuberenone, 4,4'-dihydroxybenzophenone, 2,2-dimethoxy-2-phenylacetophenone, 4-(dimethylamino)benzophenone, 4,4'-dimethylbenzil, 2,5-dimethylbenzophenone, 3,4-dimethylbenzophenone, diphenyl(2,4,6-trimethylbenzoyl)phosphine oxide/2-hydroxy-2-methylpropiophenone, 50/50 blend, 4'-ethoxyacetophenone, 2,4,6-trimethylbenzoyldiphenylphophine oxide, phenyl bis(2,4,6-trimethyl benzoyl) phosphine oxide, ferrocene, 3'-hydroxyacetophenone, 4'-hydroxyacetophenone, 3-hydroxybenzophenone, 4-hydroxybenzophenone, 1-hydroxycyclohexyl phenyl ketone, 2-hydroxy-2-methylpropiophenone, 2-methylbenzophenone, 3-methylbenzophenone, methylbenzoylformate, 2-methyl-4'-(methylthio)-2-morpholinopropiophenone, phenanthrenequinone, 4'-phenoxyacetophenone, (cumene) cyclopentadienyl iron(ii) hexafluorophosphate, 9,10-diethoxy and 9,10-dibutoxyanthracene, 2-ethyl-9,10-dimethoxyanthracene, thioxanthen-9-one and combinations thereof.

In certain embodiments of the invention, the curable composition does not comprise a photoinitiator. In other embodiments, the curable composition comprises one or more photoinitiators that are not cationic photoinitiators.

The amount of photoinitiator is not considered to be critical, but may be varied as may be appropriate depending upon the photoinitiator(s) selected, the amounts and types of ethylenically unsaturated compounds present in the curable composition, the radiation source and the radiation conditions used, among other factors. Typically, however, the amount of photoinitiator may be from 0.05% to 5%, preferably 0.1% to 5% and most preferably 1% to 4.5% by weight, based on the total weight of the curable composition.

In certain embodiments of the invention, the curable compositions described herein do not include any initiator and are curable (at least in part) with electron beam energy. In other embodiments, the curable compositions described herein include at least one free radical initiator that decomposes when heated or in the presence of an accelerator and are curable chemically (i.e., without having to expose the curable composition to radiation). The at least one free radical initiator that decomposes when heated or in the presence of an accelerator may, for example, comprise a peroxide or azo compound. Suitable peroxides for this purpose may include any compound, in particular any organic compound, that contains at least one peroxy (—O—O—) moiety, such as, for example, dialkyl, diaryl and aryl/alkyl peroxides, hydroperoxides, percarbonates, peresters, peracids, acyl peroxides and the like. The at least one accelerator may comprise, for example, at least one tertiary amine and/or one or more other reducing agents based on M-containing salts (such as, for example, carboxylate salts of transition M-containing such as iron, cobalt, manganese, vanadium and the like and combinations thereof). The accelerator(s) may be selected so as to promote the decomposition of the free radical initiator at room or ambient temperature to generate active free radical species, such that curing of the curable composition is achieved without having to heat or bake the curable composition. In other embodiments, no accelerator is present and the curable composition is heated to a temperature effective to cause decomposition of the free radical initiator and to generate free radical species which initiate curing of the polymerizable compound(s) present in the curable composition.

Thus, in various embodiments of the present invention, the curable compositions described herein are curable by techniques selected from the group consisting of radiation curing (UV radiation or electron beam curing), electron beam curing, chemical curing (using a free radical initiator that decomposes when heated or in the presence of an accelerator, e.g., peroxide curing), heat curing or combinations thereof.

Impact Modifiers

According to certain embodiments of the invention, the curable composition may comprise one or more impact modifiers. Any of the types of impact modifiers known in the polymer art may be used, but the addition of impact modifiers which are block copolymers is particularly advantageous. The curable composition may comprise, for example, one or more thermoplastic acrylic block copolymers. The block copolymer may have a core-shell structure. According to a first embodiment, the matrix is composed of at least one thermoplastic acrylic block copolymer having a general formula $(A)_nB$ in which: n is an integer of greater than or equal to 1 and A is an acrylic or methacrylic homo- or copolymer having a Tg of greater than 50° C., preferably of greater than 80° C. or polystyrene or an acrylic/styrene or methacrylic/styrene copolymer. Tg (glass transition temperature) is measured using a differential scanning calorimeter (DSC), after a second heating pass, according to standard ISO 11357-2. The heating and cooling rate is 20° C./min.

Preferably, A is methyl methacrylate, phenyl methacrylate, benzyl methacrylate or isobornyl methacrylate. Preferably, the block A is PMMA or PMMA modified with acrylic or methacrylic comonomers; B is an acrylic or methacrylic homo- or copolymer having a Tg of less than 20° C., preferably consisting of methyl acrylate, ethyl acrylate, butyl acrylate, ethylhexyl acrylate or butyl methacrylate, more preferably butyl acrylate.

Furthermore, the blocks A and/or B can comprise other acrylic or methacrylic comonomers carrying various functional groups known to a person skilled in the art, for example acid, amide, amine, hydroxyl, epoxy or alkoxy functional groups. The block A can incorporate carboxylic acid functional groups, such as acrylic acid or methacrylic acid, in order to increase the temperature stability thereof.

The thermoplastic acrylic block copolymer may have a structure selected from: ABA, AB, $A_3B$ and $A_4B$. Preferably, the thermoplastic acrylic block copolymer is chosen from the following triblock copolymers: pMMA-pBuA-pMMA, p(MMAcoMAA)-pBuA-p(MMAcoMAA) and p(MMAcoAA)-pBuA-p(MMAcoAA). In one embodiment, the block copolymer is of MAM type (PMMA-pBuA-PMMA). The block B may represent from 25% to 75% of the total weight of the block copolymer, e.g., preferably from 40% to 65%. The block B may have a weight-average molecular weight of between 10,000 g/mol and 300,000 g/mol, e.g., preferably from 20,000 g/mol to 150,000 g/mol.

Other suitable types of impact modifiers useful in the present invention include non-acrylic block copolymers such as, for example, block copolymers of vinyl aromatic monomers and dienes and hydrogenated derivatives thereof. Examples of such block copolymers include linear and radial block copolymers comprising at least one block which is a polystyrene block and at least one block which is a polydiene block such as polybutadiene or polyisoprene or a hydrogenated polybutadiene or hydrogenated polyisoprene block (e.g., SBS block copolymers, SIS block copolymers).

Block copolymers useful as impact modifiers in the curable compositions of the present invention are available from commercial sources, including, for example, the block copolymer impact modifiers sold under the brand names "Nanostrength" and "Durastrength" by Arkema as well as the non-acrylic styrenic block copolymers sold under the brand name "Kraton" by Kraton Corporation.

While an impact modifier is an optional component of the curable compositions described herein, where present it may comprise, for example, up to 20% by weight of the curable composition (e.g., from 0.5 to 15% by weight).

Other Components of the Curable Compositions

Advantageously, the curable compositions of the present invention may be formulated to be solvent-free, i.e., free of any non-reactive volatile substances.

However, in certain other embodiments of the invention, the curable composition may contain one or more solvents, in particular one or more organic solvents, which may be non-reactive organic solvents. In various embodiments, the solvent(s) may be relatively volatile, e.g., solvents having a boiling point at atmospheric pressure of not more than 150° C. In other embodiments, the solvent(s) may have a boiling point at atmospheric pressure of at least 40° C.

The solvent(s) may be selected so as to be capable of solubilizing one or more components of the curable composition and/or adjusting the viscosity or other rheological properties of the curable composition.

However, the curable compositions of the present invention may alternatively be formulated so as to contain little or no non-reactive solvent, e.g., less than 10% or less than 5% or even 0% non-reactive solvent, based on the total weight of the curable composition. Such solvent-less or low-solvent compositions may be formulated using various components, including for example low viscosity reactive diluents (such as a monomeric (meth)acrylate-functionalized compound or polymerizable heterocyclic moiety-containing compound), which are selected so as to render the curable composition sufficiently low in viscosity, even without solvent being present, that the curable composition can be easily applied at a suitable application temperature to a substrate surface so as to form a relatively thin, uniform layer.

Suitable solvents may include, for example, organic solvents such as: ketones; esters; carbonates; alcohols; aromatic solvents such as xylene, benzene, toluene and ethylbenzene; alkanes; glycol ethers; ethers; amides; as well as combinations thereof.

In various embodiments of the invention, the curable compositions described herein are formulated to have a viscosity of less than 5000 cPs (mPa·s) or less than 4000 cPs (mPa·s) or less than 3000 cPs (mPa·s) or less than 2500 cPs (mPa·s) or less than 2000 cPs (mPa·s) or less than 1500 cPs (mPa·s) or less than 1000 cPs (mPa·s) or even less than 500 cPs (mPa·s) as measured at 25° C. using a Brookfield viscometer, model DV-II, using a 27 spindle (with the spindle speed varying typically between 20 and 200 rpm, depending on viscosity). In advantageous embodiments of the invention, the viscosity of the curable composition is from 200 to 1000 cPs (mPa·s) at 25° C.

The curable compositions of the present invention may optionally contain one or more additives instead of or in addition to the above-mentioned ingredients. Such additives include, but are not limited to, antioxidants, ultraviolet absorbers, light blockers, photostabilizers, foam inhibitors, flow or leveling agents, colorants, pigments, dispersants (wetting agents), slip additives, fillers, thixotropic agents, matting agents, thermoplastics such as acrylic resins that do not contain any free radical-polymerizable functional groups, waxes or other various additives, including any of the additives conventionally utilized in the coating, sealant, adhesive, molding, 3D printing or ink arts.

Uses of the Curable Compositions

The inventive curable compositions described herein may be compositions that are to be subjected to curing by means of free radical polymerization or other types of polymerization (e.g., cationic polymerization). End use applications for the inventive curable compositions include, but are not limited to, inks, coatings, adhesives, 3D printing resins, molding resins, sealants, composites and the like.

According to certain embodiments, the curable compositions may be formulated such that they are fully curable at ambient or room temperature. In other embodiments, however, the curable compositions are formulated such that partial curing takes place at ambient or room temperature, with further curing being accomplished by heating the partially cured composition to an elevated temperature. For example, the initial curing may be carried out by exposing the curable composition to an amount of radiation (e.g., ultraviolet light) effective to react (at least in part) the components of the curable composition containing polymerizable ethylenically unsaturated functional groups, with further curing being effected by heating the curable composition to a temperature effective to initiate reaction of the components of the curable composition containing polymerizable heterocyclic-containing moieties. In such instances, curing may be considered to involve two stages: a first curing stage involving radiation (e.g., photo) curing and a second stage involving thermal curing.

Thus, in one embodiment, the curable composition is supplied as a two component system. A first component A would contain one or more polymerizable, ethylenically unsaturated metal complexes; one or more polymerizable, ethylenically unsaturated compounds other than a polymerizable, ethylenically unsaturated metal complex and, optionally, one or more photoinitiators, but no polymerizable, heterocyclic moiety-containing compound, while a second component B would contain one or more polymerizable, heterocyclic moiety-containing compounds; optionally, one or more polymerizable, ethylenically unsaturated compounds other than a polymerizable, ethylenically unsaturated metal complex and, optionally, one or more photoinitiators, but no polymerizable, ethylenically unsaturated metal complex. Thus, the polymerizable, ethylenically unsaturated metal complex(es) and the polymerizable, heterocyclic moiety-containing compound(s) are maintained in separate components of the system. Such a two component system is advantageous in embodiments where the polymerizable, ethylenically unsaturated metal complex(es) has or have some activity at normal storage temperatures (e.g., 15 to 30° C.) towards the polymerizable, heterocyclic moiety-containing compound(s), such that reaction (polymerization/curing) of the polymerizable, heterocyclic moiety-containing compound(s) takes place at a significant rate at such temperatures. The A and B components thus are stored separately until such time as it is desired to fabricate an article from the curable composition or otherwise use the curable composition. At such time, the two components are mixed together to form the curable composition. Typically, the ingredients of the curable composition are advantageously selected such that the curable composition, as initially formed and prior to any curing, is liquid and has a desirably low viscosity at 25° C. The effective potlife of the curable composition will be determined by a number of factors, including for example the relative concentrations of each of the constituents of the curable concentration, the temperature of operation and the nature and reactivity of each of the constituents. For example, the potlife will be shorter if the polymerizable, ethylenically unsaturated metal complex is highly active with respect to its ability to cause polymerization of the polymerizable, heterocyclic moiety-containing compound(s) present in the curable composition. Once the A and B components are combined to provide the curable composition, the curable composition may, while still liquid or otherwise processable, be formed into a particular configuration as may be desired depending upon the intended end use application. For example, the curable composition may be introduced into a mold, applied as a layer or coating to a substrate surface, applied as an adhesive between two substrates or used in a 3D printing process to form an article. The curable composition may then be exposed to a suitable source of radiation, such as ultraviolet light, under conditions effective to cure the polymerizable, ethylenically unsaturated species present in the curable composition. Polymerization or curing of the polymerizable, heterocyclic moiety-containing compound(s) may at least begin to take place prior to or during such an irradiation step. Depending upon the ingredients selected for use in the curable composition and their reactivities, it may not be necessary to apply heat to the curable composition in order to attain a satisfactory degree of curing of the polymerizable, heterocyclic moiety-containing compound(s). However, to effect a full cure of the curable composition or to shorten the time needed to achieve full cure, it will typically be desirable to heat the curable composition to a temperature above ambient or room temperature. Heating may be accomplished by any suitable method known in the art including, for example, by baking an article comprised or prepared using the curable composition in an oven. Heating temperatures may vary significantly, depending upon the particular make-up and characteristics of the curable composition, but baking the curable composition at a temperature of from 80 to 220° C. for a time of from 30 minutes to 12 hours will typically be suitable.

However, in other embodiments of the invention, the reactivity of the polymerizable, ethylenically unsaturated metal complex(es) towards the polymerizable, heterocyclic moiety-containing compound(s) is sufficiently low at ambient or room temperature that the curable composition can be formulated, stored and used as a one component system. In such cases, the curable composition, when employed for its intended use, may be initially "set" (e.g., converted from liquid to solid form) by exposure to a radiation source such that the polymerizable sites of ethylenic unsaturation present in certain components of the curable composition are reacted or cured. The partially cured composition is then heated to a temperature effective to cause reaction of the polymerizable, heterocyclic moiety-containing compound(s) present, thereby fully curing the curable composition. Such heating conditions may, for example, be similar to those described above.

Cured compositions prepared from curable compositions as described herein may be used, for example, in three-dimensional articles (wherein the three-dimensional article may consist essentially of or consist of the cured composition), coated articles (wherein a substrate is coated with one or more layers of the cured composition), laminated or adhered articles (wherein a first component of the article is laminated or adhered to a second component by means of the cured composition), composite articles or printed articles (wherein graphics or the like are imprinted on a substrate, such as a paper, plastic or M-containing substrate, using the cured composition).

A curable composition to be used in a three dimensional printing process in accordance with aspects of the present invention may comprise:
a) at least one polymerizable, ethylenically unsaturated metal complex;
b) at least one polymerizable, ethylenically unsaturated compound other than a polymerizable, ethylenically unsaturated metal complex;
c) at least one polymerizable heterocyclic moiety-containing compound (e.g., one or more epoxides, oxetanes, cyclic carbonates, lactides and/or lactones);
d) optionally, at least one photoinitiator and
e) optionally, at least one impact modifier.

In certain embodiments, the curable composition which is employed as a resin in a three dimensional printing process may comprise, for example:
a) 5 to 70%, preferably 5-20% and most preferably 7-15% by weight of at least one polymerizable, ethylenically unsaturated metal complex;
b) 10 to 60%, preferably 10 to 40% and most preferably 15-30% by weight of at least one polymerizable, ethylenically unsaturated compound other than a polymerizable, ethylenically unsaturated metal complex;
c) 20 to 60%, preferably 35 to 60% and most preferably 45-55% by weight of at least one polymerizable heterocyclic moiety-containing compound (e.g., one or more epoxides, oxetanes, cyclic carbonates, lactides and/or lactones);
d) 0 to 5% by weight (e.g., 0.05 to 5% by weight) of at least one photoinitiator and
e) 0 to 20% by weight (e.g., 0.5 to 15% by weight) of at least one impact modifier; the weight % of each component being based on the total weight of the curable composition.

Curing of compositions in accordance with the present invention may be carried out by any suitable method, such as free radical and/or cationic polymerization. One or more initiators, such as a free radical initiator (e.g., photoinitiator, peroxide initiator) may be present in the curable composition. Prior to curing, the curable composition may be applied to a substrate surface in any known conventional manner, for example, by spraying, knife coating, roller coating, casting, drum coating, dipping and the like and combinations thereof. Indirect application using a transfer process may also be used. A substrate may be any commercially relevant substrate, such as a high surface energy substrate or a low surface energy substrate, such as a metal substrate or plastic substrate, respectively. The substrates may comprise metal, paper, cardboard, glass, thermoplastics such as polyolefins, polycarbonate, acrylonitrile butadiene styrene (ABS) and blends thereof, composites, wood, leather and combinations thereof. When used as an adhesive, the curable composition may be placed between two substrates and then cured, the cured composition thereby bonding the substrates together to provide an adhered article.

Curing may be accelerated or facilitated by supplying energy to the curable composition, such as by heating the curable composition and/or by exposing the curable composition to a radiation source, such as visible or UV light, infrared radiation and/or electron beam radiation. Thus, the cured composition may be deemed the reaction product of the curable composition, formed by curing.

A plurality of layers of a curable composition in accordance with the present invention may be applied to a substrate surface; the plurality of layers may be simultaneously cured (by exposure to a single dose of radiation, for example) or each layer may be successively cured before application of an additional layer of the curable composition.

The inventive curable compositions described herein are especially useful as 3D printing resin formulations, that is, compositions intended for use in manufacturing three dimensional articles using 3D printing techniques. Such three dimensional articles may be free-standing/self-supporting and may consist essentially of or consist of a composition in accordance with the present invention that has been cured. The three-dimensional article may also be a composite, comprising at least one component consisting essentially of or consisting of a cured composition as previously mentioned as well as at least one additional component comprised of one or more materials other than such a cured composition (for example, a metal component or a thermoplastic component). The curable compositions of the present invention are particularly useful in digital light printing (DLP), although other types of three dimensional (3D) printing methods may also be practiced using the inventive curable compositions.

A method of making a three-dimensional article using a curable composition in accordance with the present invention may comprise the steps of:
a) coating a first layer of a curable composition in accordance with the present invention onto a surface;
b) curing the first layer, at least partially, to provide a cured first layer;
c) coating a second layer of the curable composition onto the cured first layer;
d) curing the second layer, at least partially, to provide a cured second layer adhered to the cured first layer and
e) repeating steps c) and d) a desired number of times to build up the three-dimensional article.

Although the photocuring steps may be carried out by any suitable means, which will in some cases be dependent upon the components present in the curable composition, in certain embodiments of the invention the photocuring is accomplished by exposing the layer to be cured to an effective amount of radiation (e.g., electron beam radiation, UV radiation, visible light, etc.). The three-dimensional article which is formed may be heated in order to effect thermal curing.

Accordingly, in various embodiments, the present invention provides a process comprising the steps of:
a) coating a first layer of a curable composition in accordance with the present invention and in liquid form onto a surface;
b) exposing the first layer imagewise to actinic radiation to form a first exposed imaged cross-section, wherein the radiation is of sufficient intensity and duration to cause at least partial curing (e.g., at least 50% curing, as measured by the % conversion of the polymerizable ethylenically unsaturated functional groups initially present in the curable composition) of the layer in the exposed areas;
c) coating an additional layer of the curable composition onto the previously exposed imaged cross-section;
d) exposing the additional layer imagewise to actinic radiation to form an additional imaged cross-section, wherein the radiation is of sufficient intensity and duration to cause at least partial curing (e.g., at least 50% curing, as measured by the % conversion of the polymerizable ethylenically unsaturated functional groups initially present in the curable composition) of the additional layer in the exposed areas and to cause adhesion of the additional layer to the previously exposed imaged cross-section;

e) repeating steps c) and d) a desired number of times to build up the three-dimensional article.

The process may comprise a further step f) comprising heating the three-dimensional article to a temperature effective to thermally cure the curable composition (i.e., to react the polymerizable, heterocyclic moiety-containing compound(s) present in the curable composition).

Within this specification, embodiments have been described in a way which enables a clear and concise specification to be written, but it is intended and will be appreciated that embodiments may be variously combined or separated without departing from the invention. For example, it will be appreciated that all preferred features described herein are applicable to all aspects of the invention described herein.

In some embodiments, the invention herein can be construed as excluding any element or process step that does not materially affect the basic and novel characteristics of the curable composition or process using the curable composition. Additionally, in some embodiments, the invention can be construed as excluding any element or process step not specified herein.

Although the invention is illustrated and described herein with reference to specific embodiments, the invention is not intended to be limited to the details shown. Rather, various modifications may be made in the details within the scope and range of equivalents of the claims and without departing from the invention.

Certain aspects of the present invention may be summarized as follows:

Aspect 1: A curable composition comprised of, consisting of or consisting essentially of:
a) at least one polymerizable, ethylenically unsaturated metal complex;
b) at least one polymerizable, ethylenically unsaturated compound other than a polymerizable, ethylenically unsaturated metal complex and
c) at least one polymerizable heterocyclic moiety-containing compound other than an epoxy-containing compound.

Aspect 2: The curable composition of Aspect 1, wherein the at least one polymerizable, ethylenically unsaturated metal complex includes at least one polymerizable, ethylenically unsaturated metal complex comprised of at least one (meth)acrylate group.

Aspect 3: The curable composition of Aspect 1, wherein the at least one polymerizable, ethylenically unsaturated metal complex includes at least one polymerizable, ethylenically unsaturated metal complex comprising a metal selected from the group consisting of Zn, Ti, Ca, Mg, Al, Zr, Hf, Ga, Cr, La, Ce, Nd, Sm, Gd, Tb, Dy, Ho, Er, Tm, Yb and Lu.

Aspect 4: The curable composition of any of Aspects 1 to 3, wherein the at least one polymerizable, ethylenically unsaturated metal complex includes at least one polymerizable, ethylenically unsaturated metal carboxylate prepared by reacting (A) a metal compound with (B) an acid functional compound which is a reaction product of a reactive mixture comprising (i) an alpha-beta ethylenically unsaturated hydroxyl-functionalized compound and (ii) a carboxylic polyacid or anhydride.

Aspect 5: The curable composition of any of Aspects 1 to 4, wherein the at least one polymerizable, ethylenically unsaturated metal complex includes at least one polymerizable, ethylenically unsaturated metal complex comprised of an ethylenically unsaturated beta-diketonate ligand.

Aspect 6: The curable composition of any one of Aspects 1 to 5, wherein the at least one polymerizable heterocyclic moiety-containing compound includes at least one polymerizable heterocyclic moiety-containing compound selected from the group consisting of oxetanes, cyclic carbonates, lactides and lactones or wherein the curable composition is comprised of a) at least one polymerizable heterocyclic moiety-containing compound selected from the group consisting of oxetanes, cyclic carbonates, lactides and lactones and b) at least one epoxide.

Aspect 7: The curable composition of any of Aspects 1 to 6, wherein the at least one polymerizable heterocyclic moiety-containing compound includes at least one polymerizable heterocyclic moiety-containing compound selected from the group consisting of caprolactone, propylene carbonate, 3-ethyl-3-hydroxymethyl oxetane, 3,3'-[1,4-phenylenebis(methyleneoxymethylene)]bis[3-ethyloxetane], 3-ethyl-3-[[(2-ethylhexyl)oxy]methyl]oxetane, ethylene carbonate, glycerol carbonate, lactide and valerolactone.

Aspect 8: The curable composition of any of Aspects 1 to 7, wherein the at least one polymerizable, ethylenically unsaturated compound other than a polymerizable, ethylenically unsaturated metal complex includes at least one (meth)acrylate-functionalized compound.

Aspect 9: The curable composition of any of Aspects 1 to 8, wherein the at least one polymerizable, ethylenically unsaturated compound other than a polymerizable, ethylenically unsaturated metal complex includes at least one (meth)acrylate- and hydroxy-functionalized compound.

Aspect 10: The curable composition of any of Aspects 1 to 9, wherein the at least one polymerizable, ethylenically unsaturated compound other than a polymerizable, ethylenically unsaturated metal complex includes at least one (meth)acrylate- and epoxy-functionalized compound.

Aspect 11: The curable composition of any of Aspects 1 to 10, wherein the at least one polymerizable, ethylenically unsaturated compound other than a polymerizable, ethylenically unsaturated metal complex includes at least one compound selected from the group consisting of caprolactone adducts of hydroxyalkyl (meth)acrylates, tricyclodecane dimethanol diacrylate, cyclic trimethylolpropane formal acrylate, tricyclodecane methanol(meth)acrylate, tris((meth)acryloxyethyl)isocyanurate, glycerol carbonate (meth)acrylate and aliphatic polyurethane acrylates.

Aspect 12: The curable composition of any of Aspects 1 to 11, additionally comprising at least one photoinitiator.

Aspect 13: The curable composition of any of Aspects 1 to 12, additionally comprising at least one impact modifier selected from the group consisting of core-shell impact modifiers and block copolymer impact modifiers.

Aspect 14: The curable composition of any of Aspects 1 to 13, having a viscosity of not greater than 1000 (mPa·s) at 25° C.

Aspect 15: A two component system useful for preparing a curable composition in accordance with any of Aspects 1 to 14, the two component system comprising, consisting essentially of or consisting of a first component comprised of, consisting essentially of or consisting of a) and a second component comprised of, consisting essentially of or consisting of b) and c).

Aspect 16: A curable composition comprised of:
a) at least one polymerizable, ethylenically unsaturated metal complex;
b) at least one polymerizable, ethylenically unsaturated compound other than a polymerizable, ethylenically unsaturated metal complex and
c) at least one polymerizable heterocyclic moiety-containing compound.

Aspect 17: A cured composition obtained by curing the curable composition of any of Aspects 1 to 14 or Aspect 16.

Aspect 18: A method of making a cured composition, comprising exposing the curable composition of any of Aspects 1 to 14 to radiation to obtain a partially cured composition and heating the partially cured composition to obtain the cured composition.

Aspect 19: A method of making an article, comprising printing an article in a three dimensional manner using a curable composition comprised of:
a) at least one polymerizable, ethylenically unsaturated metal complex;
b) at least one polymerizable, ethylenically unsaturated compound other than a polymerizable, ethylenically unsaturated metal complex and
c) at least one polymerizable heterocyclic moiety-containing compound.

Aspect 20: The method of Aspect 19, wherein the article is cured using both radiation curing and thermal curing.

Aspect 21: The method of Aspect 19 or 20, wherein the at least one polymerizable heterocyclic moiety-containing compound includes at least one polymerizable heterocyclic moiety-containing compound selected from the group consisting of epoxides, oxetanes, cyclic carbonates, lactides and lactones.

Aspect 22: Use of the curable composition of any one of Aspects 1 to 14 or Aspect 16 or of the two-component system of Aspect 15, in the fabrication of 3D printed articles.

Aspect 23: 3D printed article wherein, it results from the cure of the curable composition of any one of Aspects 1 to 14 or Aspect 16 or from the use of Aspect 22.

EXAMPLES

General Experimental Procedures

Dynamic mechanical analysis was performed using a TA Instruments Q2000 Dynamic Mechanical Analyzer at 0.1% strain, 5° C./min temperature ramp and a deformation frequency of 1 Hz between −150 and 200° C. Samples with smaller displayed temperature windows became too soft to accurately measure outside of the window shown. The curable composition was photopolymerized in molds by passage under lamp (e.g., a microwave-powered medium pressure mercury vapor lamp commercially available from Heraeus Noblelight) on a conveyor at 100 ft/min. or by using a 3D printer to produce articles of the desired shape. Articles were cleaned by wiping with a cloth clampened with isopropanol to remove residual uncured resin. Thermally cured ('baked') samples were placed in a muffle furnace or circulating-air oven at 125° C. for 16 hours unless otherwise specified.

Example 1: UV and Thermal Cure of an Acrylic-Epoxy Interpenetrating Network Using Zinc Complexes A curable composition was prepared by blending the following constituents:

| | |
|---|---|
| Zinc carboxylate mixture | 41.18 g |
| Glycidyl methacrylate | 13.92 g |
| Epoxy novolac resin | 29.47 g |
| Acryloxyethyl di(caprolactone) (SR495B, Sartomer) | 14.57 g |
| Irgacure ® 2022 photoinitiator | 0.85 g |

The zinc carboxylate mixture is a mixture of zinc carboxylate complexes that is soluble in acrylic monomers and which includes zinc (acryloxyethyl(4-methylhexahydrophthalate)acrylate, zinc di(4-methylhexahydrophthalate) and zinc diacrylate (available commercially from Sartomer as CN2430). The epoxy novolac resin is commercially available from Dow as DEN 425 and has an epoxy equivalent weight of 169-175 g/eq. Irgacure® 2022 is a blend of bis(2,4,6-trimethylbenzoyl)-phenylphosphine oxide/2-hydroxy-2-methyl-1-phenyl-propan-1-one used as a photoinitiator and is commercially available under the above name from BASF. Results of dynamic mechanical analysis of cured and uncured specimens are shown in FIG. 1.

The dynamic mechanical thermogram in FIG. 1 shows the development of an interpenetrating network (IPN) by application of a thermal secondary cure. Upon IPN formation, the storage modulus increases by between twofold and four orders of magnitude, while the loss modulus shows two distinct relaxation modes, consistent with the formation of an IPN. The rubbery mechanics of the network are dominated by the cured epoxy network, with the low temperature dynamics of the acrylic network largely preserved in the IPN.

Example 2: UV and Thermal Cure of an Acrylic-Epoxy-Carbonate Interpenetrating Network Using Zinc Complexes The curable composition below was prepared by blending the following constituents:

| | |
|---|---|
| Zinc carboxylate mixture (CN2430, Sartomer) | 37.94 g |
| Glycidyl methacrylate | 2.11 g |
| Acryloxyethyl di(caprolactone) | 4.04 g |
| Propylene carbonate | 27.20 g |
| Tricyclodecane dimethanol diacrylate (SR833S, Sartomer) | 28.0 g |
| Irgacure ® 2022 photoinitiator | 0.80 g |

The sample was prepared and analyzed as in Example 1. Results are shown in FIG. 2.

FIG. 2 demonstrates the principle of curing a resin (i.e., a curable composition) as a rigid material and applying a secondary thermal cure to reduce the stiffness of the final product to a desired level. Without wishing to be bound by theory, it is believed that the low loading of epoxy and hydroxyl functional materials serve only as initiation sites for the ring-opening polymerization of the propylene carbonate monomer molecules and the resultant polypropylene carbonate) grafted-(meth)acrylic network induces changes in the coordination environment at the zinc centers, reducing the effective crosslink density of the resin and improving the mobility of adjacent chain segments. The formation of an acyclic polycarbonate component of the resin is supported by the FT-IR spectrum of the cured resin as shown in FIG. 3, where the reduced intensity of the band at 1792 cm$^{-1}$ (associated with the C=O asymmetric stretching mode of the carbonate moiety) on going from the photo-cured resin (where the resin has only been photo-cured) to the thermally-cured resin (where the resin has been both photo-cured and thermally cured) corresponds to a decrease in the molar absorptivity (as a result of a reduced dipole moment) of the acyclic carbonate moiety in the product relative to the molar absorptivity of the cyclic carbonate moiety in the photo-cured composition.

The observed property of softening the system on thermal cure is particularly interesting for use in 3D printing applications, where a soft material may be desired in the final product but where a more rigid material is required for the manufacturing process.

Example 3: UV and Thermal Cure of an Acrylic-Epoxy Interpenetrating Network Using Zinc Complexes in the Presence of Urethane Linkages Conventional acrylic-epoxy "hybrid" resins require the use of cationic photoinitiators, the activity of which is significantly inhibited by the presence of urethane linkages in the formulation being cured. The use of zinc carboxylate complexes in accordance with the present invention permits the formation of acrylic-epoxy interpenetrating networks in the presence of urethane-containing materials.

The curable composition below was prepared by blending the following constituents:

| | |
|---|---|
| Zinc carboxylate mixture (CN2430, Sartomer) | 10.0 g |
| SR531 | 20.0 g |
| CN9004 | 15.0 g |
| CN983 | 5.0 g |
| Bisphenol A diglycidyl ether, (DER331, Dow) | 4.0 g |
| 3-Ethyl-3-hydroxymethyl oxetane (OXT-101, Sanyo Chemical) | 3.0 g |
| Cyclohexane dimethanol diglycidyl ether (Erisys ® GE-22, Emerald Performance Materials) | 35.0 g |
| Irgacure ® 2022 photoinitiator | 0.80 g |

SR531 is cyclic trimethylolpropane formal acrylate available commercially from Sartomer.

CN9004 is an aliphatic polyurethane acrylate prepared from a polyether polyol and available commercially from Sartomer. $M_n$~4500.

CN983 is an aliphatic polyurethane acrylate prepared from a polyester polyol and available commercially from Sartomer. $M_n$~800.

The results obtained are shown in FIG. 4. As in FIG. 1, FIG. 4 shows the development of an interpenetrating network by application of a thermal secondary cure, this time in the presence of urethane linkages. Were the zinc carboxylate mixture of Example 3 replaced by a (meth)acrylic crosslinker of similar molecular weight and (meth)acrylate functionality and a cationic photoinitiator such as triphenylsulfonium hexafluoroantimonate added to the formulation to initiate polymerization of the epoxy resins as is well known in the art, the basicity of the nitrogen atom in the urethane linkages of the aliphatic polyurethane acrylates would inhibit the polymerization of the epoxide and oxetane components due to sequestration of the initiating species (a proton). In contrast, the metal centers in the cured composition of Example 3 are competent catalysts for the polymerization of heterocyclic moiety-containing compounds even in the presence of the basic urethane linkages, with changes to the dynamic moduli and loss tangent comparable to those demonstrated in FIG. 1 for the composition of Example 1. The large number of low-amplitude modes in the loss modulus thermogram are principally attributed to a combination of network motions and changes in local hydrogen bonding environments as a function of temperature.

The invention claimed is:

1. A curable composition comprised of:
   a) at least one polymerizable, ethylenically unsaturated metal complex;
   b) at least one polymerizable, ethylenically unsaturated compound other than a polymerizable, ethylenically unsaturated metal complex; and
   c) at least one polymerizable heterocyclic moiety-containing compound other than an epoxy-containing compound,
   wherein the composition does not comprise a cationic photoinitiator.

2. The curable composition of claim 1, wherein the at least one polymerizable, ethylenically unsaturated metal complex includes at least one polymerizable, ethylenically unsaturated metal complex comprised of at least one (meth) acrylate group.

3. The curable composition of claim 1, wherein the at least one polymerizable, ethylenically unsaturated metal complex includes at least one polymerizable, ethylenically unsaturated metal complex comprising a metal selected from the group consisting of Zn, Ti, Ca, Mg, Al, Zr, Hf, Ga, Cr, La, Ce, Nd, Sm, Gd, Tb, Dy, Ho, Er, Tm, Yb and Lu.

4. The curable composition of claim 1, wherein the at least one polymerizable, ethylenically unsaturated metal complex includes at least one polymerizable, ethylenically unsaturated metal carboxylate prepared by reacting (A) a metal compound with (B) an acid functional compound which is a reaction product of a reactive mixture comprising (i) an alpha-beta ethylenically unsaturated hydroxyl-functionalized compound and (ii) a carboxylic polyacid or anhydride.

5. The curable composition of claim 1, wherein the at least one polymerizable, ethylenically unsaturated metal complex includes at least one polymerizable, ethylenically unsaturated metal complex comprised of an ethylenically unsaturated beta-diketonate ligand.

6. The curable composition of claim 1, wherein the at least one polymerizable heterocyclic moiety-containing compound c) includes at least one polymerizable heterocyclic moiety-containing compound selected from the group consisting of oxetanes, cyclic carbonates, lactides and lactones or wherein the curable composition is comprised of a) at least one polymerizable heterocyclic moiety-containing compound selected from the group consisting of oxetanes, cyclic carbonates, lactides and lactones and b) at least one epoxide.

7. The curable composition of claim 1, wherein the at least one polymerizable heterocyclic moiety-containing compound c) includes at least one polymerizable heterocyclic moiety-containing compound selected from the group consisting of caprolactone, propylene carbonate, 3-ethyl-3-hydroxymethyl oxetane, 3,3'-[1,4-phenylenebis(methyleneoxymethylene)]bis[3-ethyloxetane], 3-ethyl-3-[[(2-ethylhexyl)oxy]methyl]oxetane, ethylene carbonate, glycerol carbonate, lactide and valerolactone.

8. The curable composition of claim 1, wherein the at least one polymerizable, ethylenically unsaturated compound b) other than a polymerizable, ethylenically unsaturated metal complex includes at least one (meth)acrylate-functionalized compound.

9. The curable composition of claim 1, wherein the at least one polymerizable, ethylenically unsaturated compound b) other than a polymerizable, ethylenically unsaturated metal complex includes at least one (meth)acrylate- and hydroxy-functionalized compound.

10. The curable composition of claim 1, wherein the at least one polymerizable, ethylenically unsaturated compound b) other than a polymerizable, ethylenically unsaturated metal complex includes at least one (meth)acrylate- and epoxy-functionalized compound.

11. The curable composition of claim 1, wherein the at least one polymerizable, ethylenically unsaturated compound b) other than a polymerizable, ethylenically unsaturated metal complex includes at least one compound selected from the group consisting of caprolactone adducts of hydroxyalkyl (meth)acrylates, tricyclodecane dimethanol diacrylate, cyclic trimethylolpropane formal acrylate, tricyclodecane methanol(meth)acrylate, tris((meth)acryloxyethyl)isocyanurate, glycerol carbonate (meth)acrylate and aliphatic polyurethane acrylates.

12. The curable composition of claim 1, additionally comprising at least one photoinitiator other than a cationic photoinitiator.

13. The curable composition of claim 1, additionally comprising at least one impact modifier selected from the group consisting of core-shell impact modifiers and block copolymer impact modifiers.

14. The curable composition of claim 1, having a viscosity of not greater than 1000 (mPa.s) (cP) at 25° C.

15. A two component system useful for preparing a curable composition in accordance with claim 1, the two component system comprising a first component comprised of a) and a second component comprised of b) and c).

16. A curable composition comprised of :
a) at least one polymerizable, ethylenically unsaturated metal complex;
b) at least one polymerizable, ethylenically unsaturated compound other than a polymerizable, ethylenically unsaturated metal complex; and
c) at least one polymerizable heterocyclic moiety-containing compound,
wherein the composition does not comprise a cationic photoinitator.

17. A cured composition obtained by curing the curable composition of claim 1.

18. A method of making a cured composition, comprising exposing a curable composition comprising a) at least one polymerizable, ethylenically unsaturated metal complex; b) at least one polymerizable, ethylenically unsaturated compound other than a polymerizable, ethylenically unsaturated metal complex; and c) at least one polymerizable heterocyclic moiety-containing compound, wherein the composition does not comprise a cationic photoinitiator, to radiation to obtain a partially cured composition and then further curing the partially cured composition by heating the partially cured composition to obtain the cured composition.

19. A method of making an article, comprising printing an article in a three dimensional manner using a curable composition comprised of:
a) at least one polymerizable, ethylenically unsaturated metal complex;
b) at least one polymerizable, ethylenically unsaturated compound other than a polymerizable, ethylenically unsaturated metal complex; and
c) at least one polymerizable heterocyclic moiety-containing compound,
wherein the composition does not comprise a cationic photoinitiator.

20. The method of claim 19, wherein the article is cured using both radiation curing and thermal curing.

21. The method of claim 19, wherein the at least one polymerizable heterocyclic moiety-containing compound includes at least one polymerizable heterocyclic moiety-containing compound selected from the group consisting of epoxides, oxetanes, cyclic carbonates, lactides and lactones.

22. A 3D printed article resulting from curing the curable composition of claim 1.

23. The curable composition of claim 16, wherein the at least one polymerizable heterocyclic moiety-containing compound is an oxetane.

* * * * *